US012761546B2

(12) United States Patent
Lee

(10) Patent No.: US 12,761,546 B2
(45) Date of Patent: Oct. 13, 2026

(54) PHOTOMASK INCLUDING MONITORING MARK

(71) Applicant: Samsung Display Co., LTD., Yongin-si (KR)

(72) Inventor: Yoon Yeol Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 566 days.

(21) Appl. No.: 18/237,062

(22) Filed: Aug. 23, 2023

(65) Prior Publication Data

US 2024/0192583 A1 Jun. 13, 2024

(30) Foreign Application Priority Data

Dec. 12, 2022 (KR) ........................ 10-2022-0172225

(51) Int. Cl.
*G03F 1/44* (2012.01)

(52) U.S. Cl.
CPC ...................................... *G03F 1/44* (2013.01)

(58) Field of Classification Search
CPC ..... G03F 1/44; G03F 1/42; G03F 1/50; G03F 7/2053
USPC ................................................. 430/5, 30, 22
See application file for complete search history.

(56) References Cited

U.S. PATENT DOCUMENTS 5,674,650 A 10/1997 Dirksen et al.
6,317,211 B1 * 11/2001 Ausschnitt .......... G03F 7/70633 356/400
7,108,945 B2 9/2006 Sutani et al.
7,538,867 B2 5/2009 Murai
10,963,614 B2 3/2021 Kim et al.
2002/0097399 A1 * 7/2002 Ausschnitt .......... G03F 7/70641 356/401
2002/0177057 A1 11/2002 Grodnensky
(Continued)

FOREIGN PATENT DOCUMENTS

EP 0721608 B1 10/2003
KR 20030078014 A 10/2003
(Continued)

OTHER PUBLICATIONS

Richard A. Lawson and Alex P.G. Robinson, "Overview of Materials and Processes for Lithography" Frontier of Nanoscience 2016, 11, 1-90.

*Primary Examiner* — Caleen O Sullivan
(74) *Attorney, Agent, or Firm* — CANTOR COLBURN LLP

(57) ABSTRACT

A photomask includes: a base, a pattern layer disposed on the base, and a monitoring mark including a first sub-monitoring mark which includes a plurality of test patterns defined as openings penetrating the base and the pattern layer. The first sub-monitoring mark includes first through n-th test patterns, each of the first through n-th test patterns includes a first edge and a second edge extending along a first direction and facing each other along a second direction different from the first direction, the second edge of a j-th test pattern among the first through n-th test patterns is spaced apart from the first edge of the j-th test pattern along the second direction by (kn+j) times a unit width that is constant along the second direction, and n is a natural number more than 1, j is a natural number from 1 to n, and k is a natural number.

20 Claims, 21 Drawing Sheets

(56) References Cited

U.S. PATENT DOCUMENTS

| | | | | |
|---|---|---|---|---|
| 2004/0137341 | A1* | 7/2004 | Niu | G03F 7/70633 430/30 |
| 2005/0105068 | A1* | 5/2005 | Komine | G03F 1/50 430/311 |
| 2010/0316939 | A1 | 12/2010 | Chung | |
| 2017/0017149 | A1* | 1/2017 | Kim | G03F 1/44 |

FOREIGN PATENT DOCUMENTS

| | | | |
|---|---|---|---|
| KR | 100429879 | B1 | 5/2004 |
| KR | 20060048094 | A | 5/2006 |
| KR | 20080047778 | A | 5/2008 |
| KR | 101127355 | B1 | 3/2012 |
| KR | 101503932 | B1 | 3/2015 |
| KR | 20160014471 | A | 2/2016 |
| KR | 20170010263 | A | 1/2017 |
| KR | 101793778 | B1 | 11/2017 |
| KR | 20210008678 | A | 1/2021 |

* cited by examiner

PHOTOMASK INCLUDING MONITORING MARK

This application claims priority to Korean Patent Application No. 10-2022-0172225, filed on Dec. 12, 2022, and all the benefits accruing therefrom under 35 U.S.C. § 119, the content of which in its entirety is herein incorporated by reference.

BACKGROUND

1. Field

The present disclosure relates to a photomask including a monitoring mark.

2. Description of the Related Art

A display device is becoming increasingly important with the development of multimedia. The display device includes a liquid crystal display ("LCDs") and an organic light emitting display ("OLEDs").

A process of manufacturing such a display device includes an exposure process. In the exposure process, an exposure device is used to form various patterns. The exposure device exposes an object to light according to a pattern formed on a photomask. The exposure device is used not only to manufacture a display device but also in an exposure process for manufacturing a photomask.

In order to realize a desired level of resolution during exposure, a laser with a relatively short wavelength is used as a light source. A raw laser beam such as an excimer laser, a gas laser, or a semiconductor laser is split into a plurality of unit laser beams, and the unit laser beams are sequentially emitted in a scanning manner. At this time, it is important to make the intensity and interval of each unit laser beam the same. In particular, intensities and positions of unit laser beams on opposite sides of the unit laser beams determine the critical dimension of a photomask pattern.

Conventionally, when a photomask is manufactured, beam power of an exposure device is monitored at specific cycles through the manufacture of a test mark. However, it is difficult to check the beam state of a photomask actually being manufactured by monitoring the exposure device at specific cycles through the manufacture of a test mark. In addition, when a problem with the beam state is detected, it is difficult to identify at what point in time the problem occurred. Therefore, there is a need for a monitoring mark for checking the critical dimension state of a photomask being manufactured as well as beam intensity and interval in real time.

SUMMARY

Aspects of the present disclosure provide a photomask including a monitoring mark that makes it possible to monitor the intensity and position of each of a plurality of unit laser beams.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, a photomask includes, a base, a pattern layer disposed on the base, and a monitoring mark including a first sub-monitoring mark which includes a plurality of test patterns defined as openings penetrating the base and the pattern layer, wherein the first sub-monitoring mark includes first through n-th test patterns, wherein each of the first through n-th test patterns includes a first edge and a second edge extending along a first direction and facing each other along a second direction different from the first direction, wherein the second edge of a j-th test pattern among the first through n-th test patterns is spaced apart from the first edge of the j-th test pattern along the second direction by (kn+j) times a unit width that is constant along the second direction, wherein n is one of natural numbers more than 1, j is any natural number from 1 to n, and k is one of natural numbers.

In an embodiment, the first through n-th test patterns may be arranged along the first direction.

In an embodiment, the first edges of the first through n-th test patterns may be aligned with each other along the first direction.

In an embodiment, the j-th test pattern among the first through n-th test patterns may have a width (kn+j) times the unit width in the second direction.

In an embodiment, the second edge of an i-th test pattern among the first through n-th test patterns may overlap an (i+1)-th test pattern along the first direction, and i is a natural number from 1 to n−1.

In an embodiment, the monitoring mark further may include a second sub-monitoring mark which includes a plurality of test patterns, the second sub-monitoring mark includes first through m-th test patterns, each of the first through m-th test patterns includes a third edge and a fourth edge extending along the first direction and facing each other along the second direction, the fourth edge of a p-th test pattern among the first through m-th test patterns of the second sub-monitoring mark is spaced apart from the third edge along a direction opposite to the second direction by (qm+p) times the unit width, a direction from the third edge to the fourth edge along the second direction is opposite to a direction from the first edge to the second edge along the second direction, and m is one of natural numbers, p is any natural number from 1 to m, and q is one of natural numbers.

In an embodiment, the first through m-th test patterns may be arranged along the first direction.

In an embodiment, the third edges of the first through m-th test patterns may be aligned with each other along the first direction.

In an embodiment, the p-th test pattern among the first through m-th test patterns may have a width (qm+p) times the unit width in the second direction.

In an embodiment, the first through n-th test patterns of the first sub-monitoring mark may be sequentially disposed along the first direction, and the first through m-th test patterns of the second sub-monitoring mark may be sequentially disposed along a direction opposite to the first direction.

In an embodiment, the first through n-th test patterns of the first sub-monitoring mark may b e arranged in the second direction with the m-th through the first test patterns of the second sub-monitoring mark, respectively.

In an embodiment, the second sub-monitoring mark may be point-symmetric to the first sub-monitoring mark.

In an embodiment, the first sub-monitoring mark may include a plurality of position patterns configured to monitor position information of the test patterns of the first sub-monitoring mark, and each of the position patterns of the first sub-monitoring mark may be disposed on one side of a corresponding one of the test patterns.

In an embodiment, the test patterns may be formed by a plurality of unit laser beams emitted from an exposure device, and the unit width may be equal to a width of each unit laser beam.

In an embodiment, the photomask further may include: a main area in which a main pattern identical to a circuit pattern formed on a display panel is disposed, and a peripheral area disposed adjacent to the main area, the monitoring mark may be disposed in the peripheral area.

According to an aspect of the present disclosure, a photomask includes, a base, a pattern layer disposed on the base, and a sub-monitoring mark including a plurality of test patterns defined as openings penetrating the base and the pattern layer, wherein the sub-monitoring mark includes first through n-th test patterns, wherein each of the first through n-th test patterns includes a first edge and a second edge extending along a first direction and facing each other along a second direction different from the first direction, wherein the first edge of an i-th test pattern among the first through n-th test patterns is spaced apart from the first edge of an (i−1)-th test pattern along the second direction by a unit width that is constant along the second direction, wherein the second edge of each of the first through n-th test patterns is spaced apart from the first edge of a same test pattern by (kn+i) times the unit width along the second direction, and wherein n is one of natural numbers, i is any natural number from 2 to n, and k is one of natural numbers.

In an embodiment, each of the first through n-th test patterns may have a width (kn+1) times the unit width in the second direction.

In an embodiment, the first through n-th test patterns may be arranged along the first direction, and the first edge of the i-th test pattern may overlap the (i−1)-th test pattern along the first direction.

According to an aspect of the present disclosure, a photomask includes: a base, a pattern layer disposed on the base, and a sub-monitoring mark including a plurality of test patterns, each including a plurality of openings penetrating the base and the pattern layer, wherein the sub-monitoring mark includes first through n-th test patterns, wherein each of the first through n-th test patterns includes the plurality of openings and a plurality of masking areas, which are extending along a first direction and alternately arranged along a second direction different from the first direction and includes a first outermost boundary and a second outermost boundary located at opposite outermost positions in the second direction and facing each other among a plurality of boundaries formed between the openings and the masking areas, wherein the first outermost boundaries of the first through n-th test patterns are aligned with each other along the first direction, wherein the second outermost boundary of a j-th test pattern among the first through n-th test patterns is spaced apart from the first outermost boundary of the j-th test pattern along the second direction by (kn+j) times a unit width that is constant along the second direction, and wherein n is one of natural numbers, j is any natural number from 1 to n, and k is one of natural numbers.

In an embodiment, the second outermost boundary may be defined as one of boundaries spaced apart from the first outermost boundary by (kn+1) to (k+1)n times the unit width.

A photomask according to an embodiment of the present disclosure may include a monitoring mark that makes it possible to monitor the intensity and position of each of a plurality of unit laser beams.

However, the effects of the present disclosure are not restricted to the one set forth herein. The above and other effects of the present disclosure will become more apparent to one of daily skill in the art to which the present disclosure pertains by referencing the claims.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises"

and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. Hereinafter, specific embodiments will be described with reference to the accompanying drawings.

Figure 1:
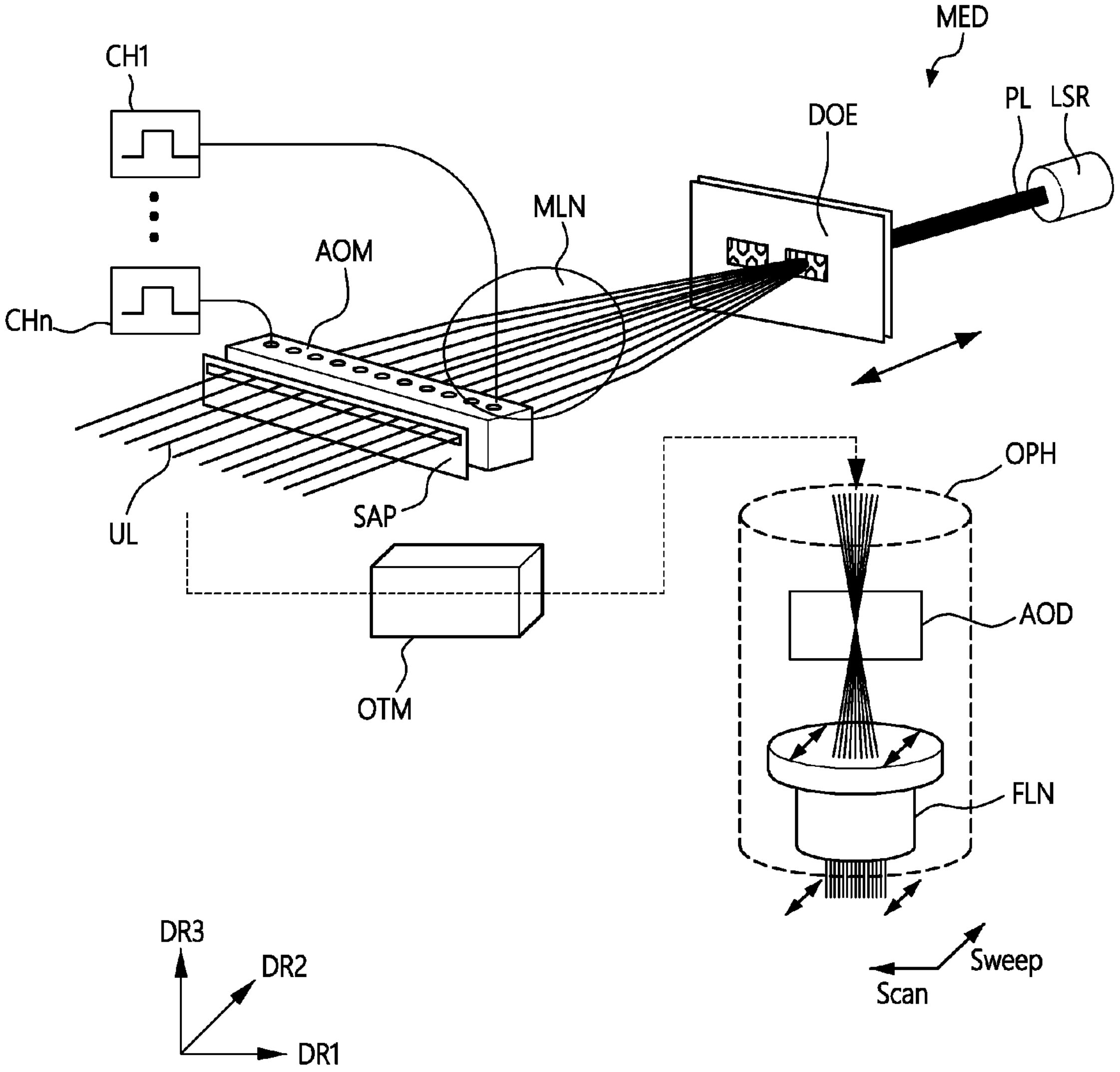
FIG. 1 is a perspective view of a photomask exposure device according to an embodiment.
Figure 2:
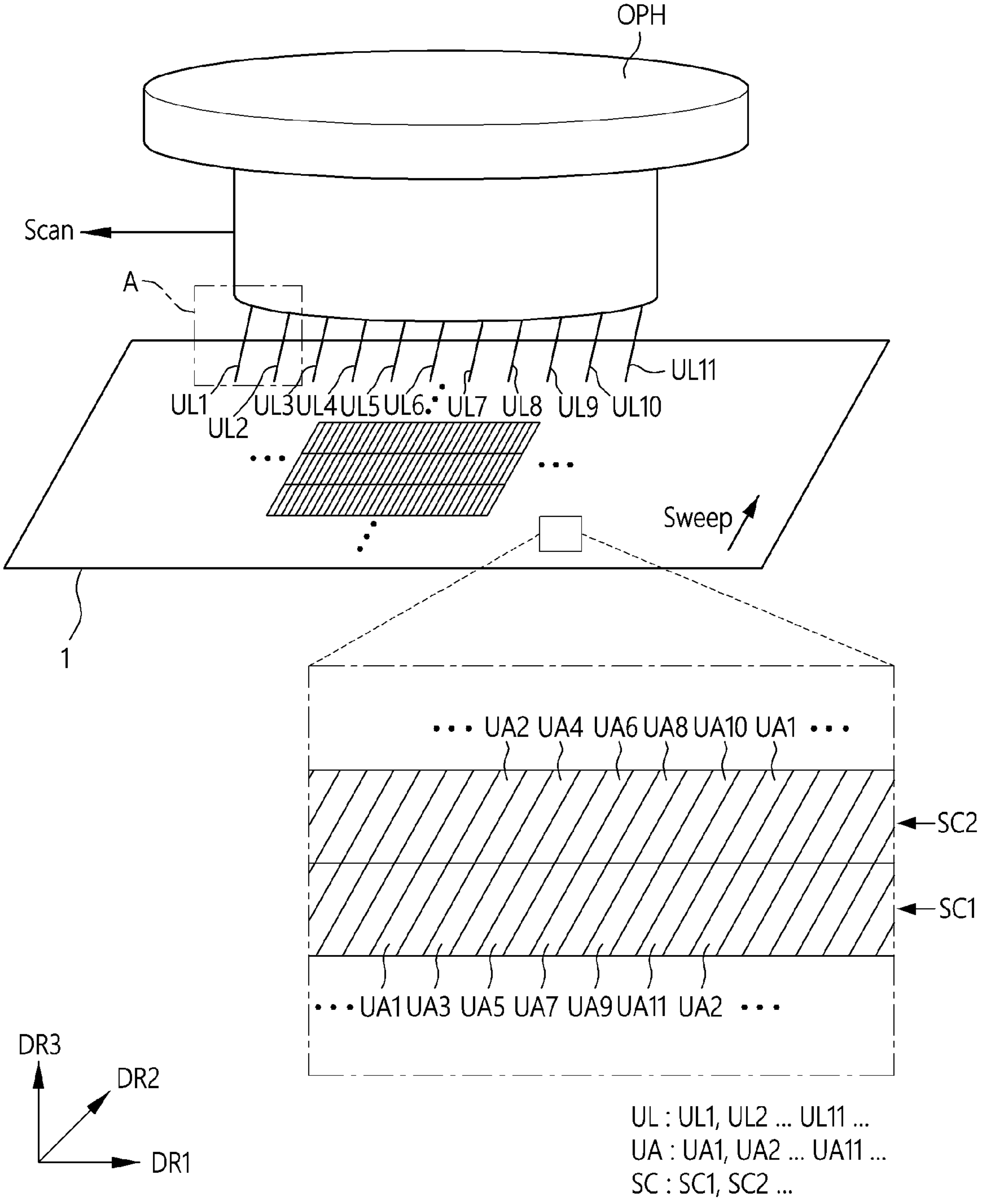
FIG. 2 is a perspective view of the photomask exposure device according to the embodiment and a photomask.
Figure 3:
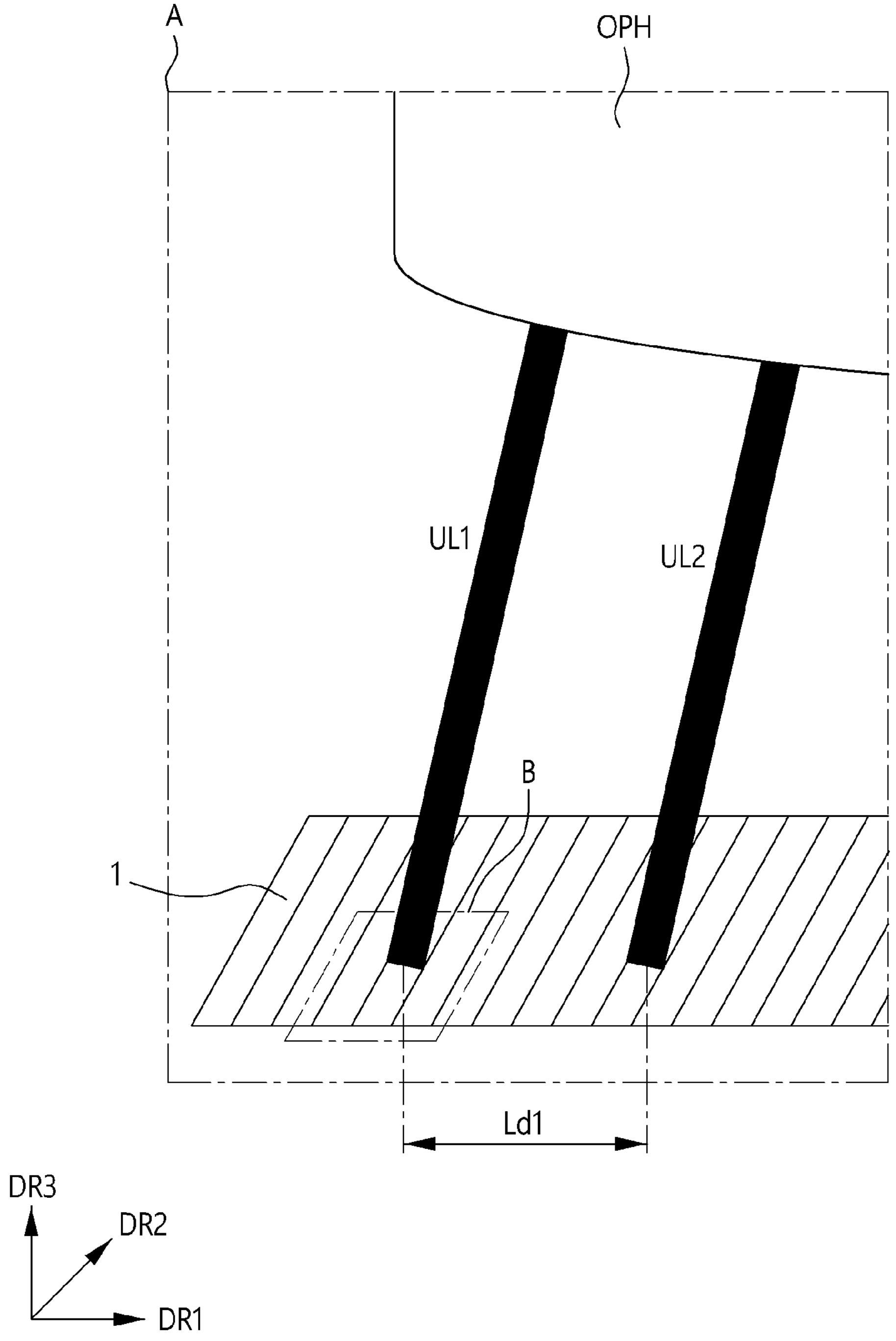
FIG. 3 is an enlarged view of portion 'A' of FIG. 2.
Figure 4:
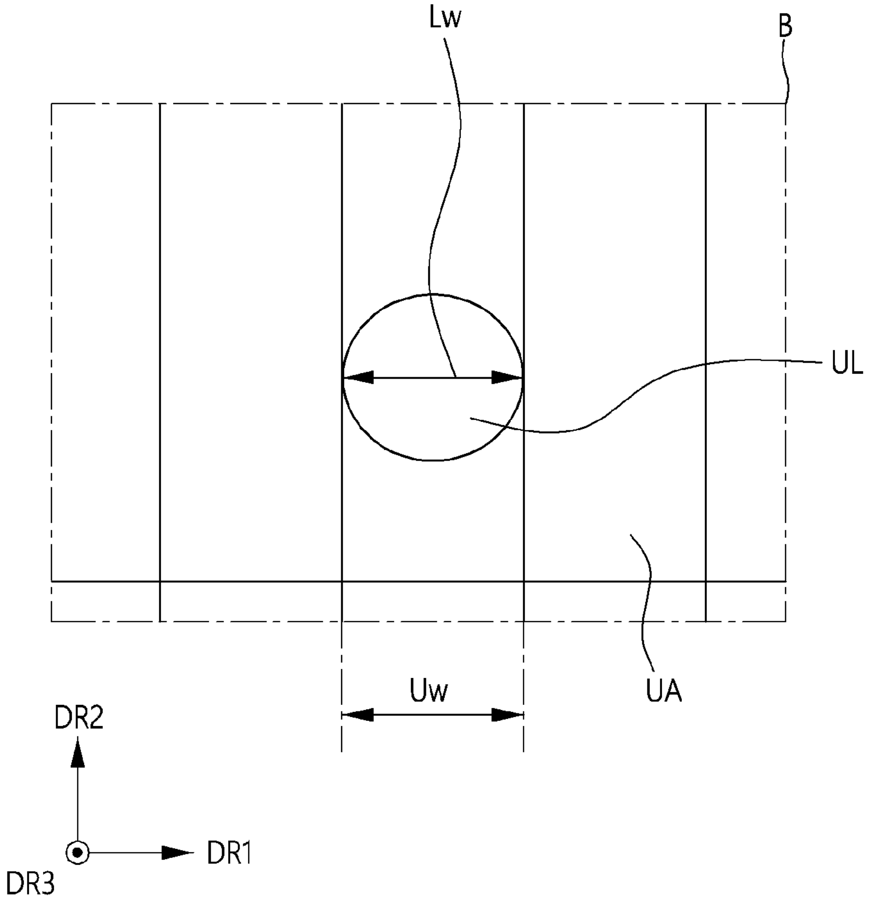
FIG. 4 is an enlarged view of portion 'B' of FIG. 3.

FIG. 1 is a perspective view of a photomask exposure device MED according to an embodiment. FIG. 2 is a perspective view of the photomask exposure device MED according to the embodiment and a photomask 1. FIG. 3 is an enlarged view of portion 'A' of FIG. 2. FIG. 4 is an enlarged view of portion 'B' of FIG. 3.

Referring to FIGS. 1 through 4, the photomask exposure device MED according to the embodiment may be an exposure device that exposes the photomask 1 to form a pattern on the photomask 1.

The photomask exposure device MED may include a light source LSR, a diffractive optical element DOE, a module lens MLN, a modulator AOM, an aperture SAP, an optical member OTM, and an optical head OPH.

The light source LSR may include a laser oscillator that can oscillate a laser. In some embodiments, the light source LSR may use, as a laser oscillator that can oscillate a laser, an excimer laser oscillator such as KrF, ArF or XeCl, a gas laser oscillator such as He, He—Cd, Ar, He—Ne or HF, a solid-state laser oscillator, or a semiconductor laser oscillator such as GaN, GaAs, GaAlAs or InGaAsP. The solid-state oscillator uses, as a medium, a material obtained by adding, as a dopant, at least any one of Nd, Yb, Cr, Ti, Ho, Er, Tm and Ta to monocrystalline YAG, $YVO_4$, forsterite ($Mg_2SiO_4$), $YAlO_3$ or $GdVO_4$ or polycrystalline (ceramic) YAG, $Y_2O_3$, $YVO_4$, $YAlO_3$ or $GdVO_4$.

Figure 5:
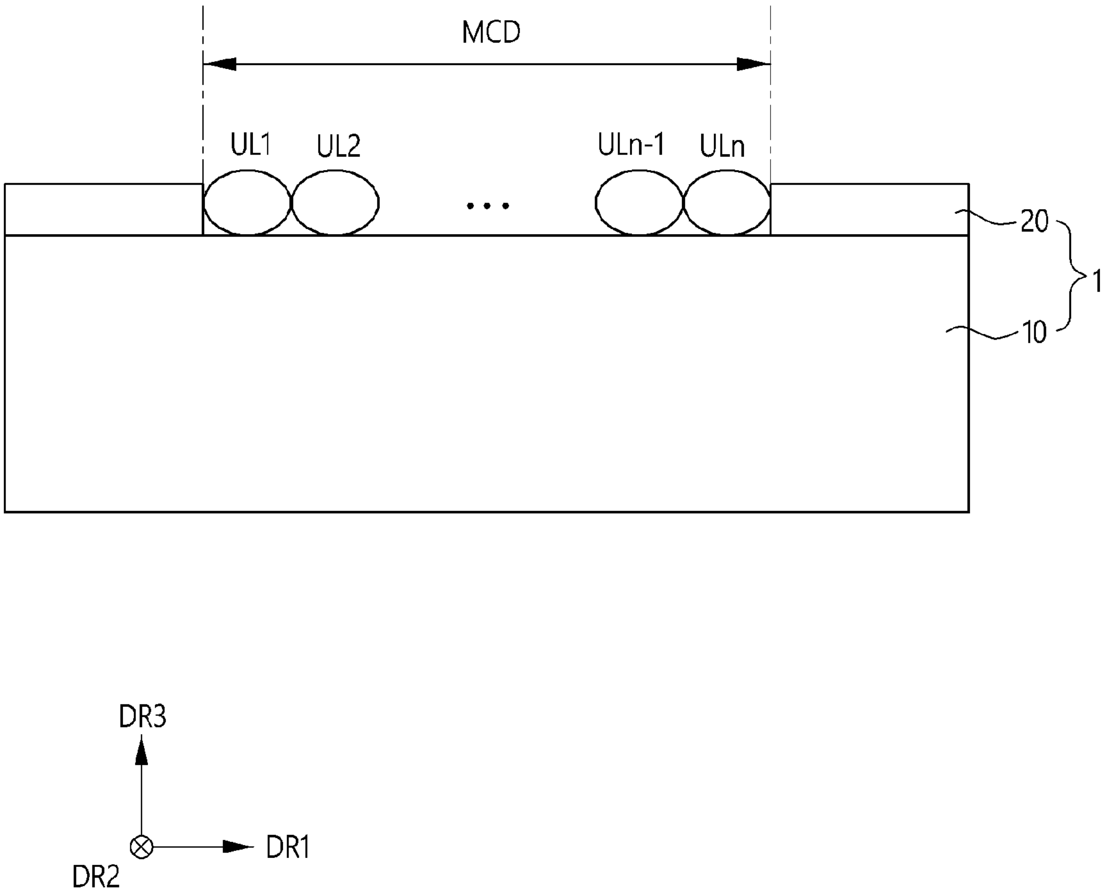
FIG. 5 is a side view illustrating a process of forming a mask pattern using unit laser beams according to an embodiment.

Any laser may be used as long as it has energy that is absorbed by a pattern layer 20 (see FIG. 5). For example, the laser may be appropriately selected from among a laser in an ultraviolet region, a laser in a visible light region, and a laser in an infrared region.

As the laser, a continuous oscillation laser beam or a pulsed oscillation laser beam may be appropriately used. In the pulsed oscillation laser beam, an oscillation frequency of several tens of Hz to several kHz is usually used. However, a pulsed oscillation laser from which a laser beam having an oscillation frequency of 10 MHz or more, which is far higher than the above oscillation frequency, and having a pulse width of picoseconds ($10^{-12}$ seconds) or femtoseconds ($10^{-15}$ seconds) is obtained may also be used.

A laser emitted from the light source LSR may be a raw laser beam PL. The raw laser beam PL may be split into a plurality of unit laser beams UL by the diffractive optical element DOE.

The diffractive optical element DOE may split the raw laser beam PL into the unit laser beams UL. In an embodiment, the diffractive optical element DOE may split the raw laser beam PL into eleven unit laser beams UL. However, the number of unit laser beams UL is not limited thereto. For ease of description, a case where the raw laser beam PL is split into eleven unit laser beams UL will be described below as an example.

The module lens MLN may be disposed between the diffractive optical element DOE and the modulator AOM. The module lens MLN may focus each unit laser beam UL on the modulator AOM.

The modulator AOM may change the intensities and/or irradiation times of the focused unit laser beams UL. The modulator AOM may include an acousto-optical modulator.

The modulator AOM may include a plurality of channels CH1 to CHn configured to control the unit laser beams UL, respectively. The channels CH1 to CHn may adjust the intensities and/or irradiation times of the unit laser beams UL according to input data, respectively.

The aperture SAP may control the amount of the unit laser beams UL to be output and may control the unit laser beams UL to be output in a certain direction. The aperture SAP may be formed in a slit shape.

The optical member OTM may be disposed on an optical path between the aperture SAP and the optical head OPH. The optical member OTM may change the optical path so that the unit laser beams UL output from the aperture SAP can be incident on the optical head OPH.

The optical head OPH is a scanning device and may reciprocate along a first direction DR1. While the optical head OPH moves along the first direction DR1, the unit laser beams UL may sweep along a second direction DR2.

In the illustrated drawings, the first direction DR1 and the second direction DR2 are horizontal directions intersecting each other. For example, the first direction DR1 and the second direction DR2 may be orthogonal to each other. In addition, a third direction DR3 may be a vertical direction intersecting and, for example, orthogonal to the first direction DR1 and the second direction DR2. In the present specification, a direction indicated by an arrow of each of the first through third directions DR1 through DR3 may be referred to as a first side, and a direction opposite to the direction may be referred to as a second side. However, if the first side or the second side is not specified, a direction may not be limited to any one of the first side and the second side.

The optical head OPH may include a deflector AOD and a final lens FLN.

The deflector AOD may deflect and sweep the unit laser beams UL onto the photomask 1. In an embodiment, an acousto-optical deflector may be included.

The final lens FLN may focus the unit laser beams UL on the photomask 1.

As illustrated in FIG. 2, the photomask 1 may include a plurality of scan areas SC extending along the first direction DR1 and arranged along the second direction DR2. In addition, the photomask 1 may include a plurality of unit areas UA extending along the second direction DR2 and arranged along the first direction DR1.

The scan areas SC refer to areas scanned by the optical head OPH of the photomask exposure device MED from a first side to a second side of the photomask 1 in the first direction DR1. In an embodiment, the optical head OPH of the photomask exposure device MED may scan a first scan area SC1 from the first side to the second side in the first direction DR1. Then, the optical head OPH may return to the first side in the first direction DR1 and move to an adjacent second scan area SC2. Then, the optical head OPH may scan the second scan area SC2 from the first side to the second side in the first direction DR1 again.

The unit areas UA may be areas on which the unit laser beams UL emitted from the photomask exposure device MED are incident, respectively. In an embodiment, first through eleventh unit laser beam UL1 through UL11 may be incident on first through eleventh unit areas UA1 through UA11, respectively.

The unit areas UA may be sequentially and repeatedly arranged along the first direction DR1. In an embodiment, the first through eleventh unit areas UA1 through UA11 may be sequentially arranged along the first direction DR1, and then the first unit area UA1 may be disposed again next to the eleventh unit area UA11.

While the optical head OPH moves along the first direction DR1, the unit laser beams UL may form pattern lines PLN (see FIG. 10) while sweeping the unit areas UA located in each of the scan areas SC.

A distance Ld1 between the unit laser beams UL may be constant. Referring to FIG. 3, in an embodiment, the distance Ld1 between the unit laser beams UL may be about 4.2 micrometers (μm).

Referring to FIG. 4, a width Uw of the unit areas UA in the first direction DR1 may be substantially equal to a width Lw of the unit laser beams UL in the first direction DR1. In an embodiment, the width Uw of the unit areas UA and the width Lw of the unit laser beams UL may each be about 0.25 μm or about 0.35 μm.

FIG. 5 is a side view illustrating a process of forming a mask pattern using unit laser beams according to an embodiment.

Referring to FIG. 5, the photomask 1 may include a base 10 and a pattern layer 20 disposed on the base 10.

The base 10 may be made of a light-transmitting material through which a laser beam can pass. For example, the base 10 may be a substrate including glass, quartz, sapphire, or ceramic.

In some embodiments, the base 10 may be omitted. When the base 10 is omitted, an opening area formed in the pattern layer 20 may be penetrated along the third direction DR3.

The pattern layer 20 may realize a predetermined circuit pattern for manufacturing a display device. The pattern layer 20 may be made of a laser absorbing material and may be made of, for example, a conductive material or an insulating material. In an embodiment, the pattern layer 20 may use an element of chromium (Cr), molybdenum (Mo), nickel (Ni), titanium (Ti), cobalt (Co), copper (Cu) or aluminum (Al), an alloy material having the above element as a main component, or a compound (a nitrogen compound, an oxygen compound, a carbon compound, a halogen compound, etc.). However, the present disclosure is not limited thereto.

In some embodiments, when the pattern layer 20 is made of a conductive material, it may be formed by a deposition method, a sputtering method, or a chemical vapor deposition ("CVD") method. Examples of the material that forms the pattern layer 20 may include, but are not limited to, semiconductor materials such as silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide and cadmium telluride strontium titanate; organic resin materials such as polyimide, acryl, polyamide, polyimide-amide, resist and benzocyclobutene; and insulating materials such as siloxane and polysilazane. In an embodiment, when the pattern layer 20 is made of an insulating material, it may be formed by a coating method.

In FIG. 5, the pattern layer 20 is formed in a single-layer structure. However, this is only an example, and the pattern layer 20 may also be formed in a multilayer structure if necessary.

Although not illustrated in the drawing, the photomask 1 may further include a photoresist layer (not illustrated) on the pattern layer 20 in a manufacturing process of the photomask 1. The formation of the photoresist layer (not illustrated) may be achieved by a known photolithography process.

A mask pattern may be formed by patterning the pattern layer 20 using the photoresist layer (not illustrated) as a mask. For example, a portion of the pattern layer 20 which is masked by a pattern formed on the photoresist layer (not illustrated) may become a mask pattern, and a portion of the pattern layer 20 which is not masked by the pattern formed on the photoresist layer (not illustrated) may be removed. In addition, a surface of the base 10 may be exposed through the removed portion of the pattern layer 20.

A method of patterning the pattern layer 20 is not limited. For example, a method such as dry etching or wet etching may be used.

If necessary, the photoresist layer (not illustrated) may be removed before a subsequent process is performed. Alternatively, the subsequent process may be performed without the removal of the photoresist layer (not illustrated).

A laser beam passes through a space area of the pattern layer 20 in which a mask pattern is not formed. The laser beam determines the critical dimension of the mask pattern. For example, n unit laser beams may be formed to be sequentially incident toward the mask pattern, and the intensities and positions of two unit laser beams located at opposite ends of the space area may play an important role in determining the critical dimension MCD of the mask pattern. In an embodiment, as illustrated in FIG. 5, the intensities and positions of a first unit laser beam UL1 and an $n^{th}$ unit laser beam ULn located at opposite ends of the space area may determine the critical dimension MCD of the mask pattern. In an embodiment, if the first unit laser beam UL1 and an $(n-1)^{th}$ unit laser beam ULn−1 are located at opposite ends unlike in the drawing, the intensities and positions of the first unit laser beam UL1 and the $(n-1)^{th}$ unit laser beam ULn−1 may determine the critical dimension MCD of the mask pattern.

Figure 6A:
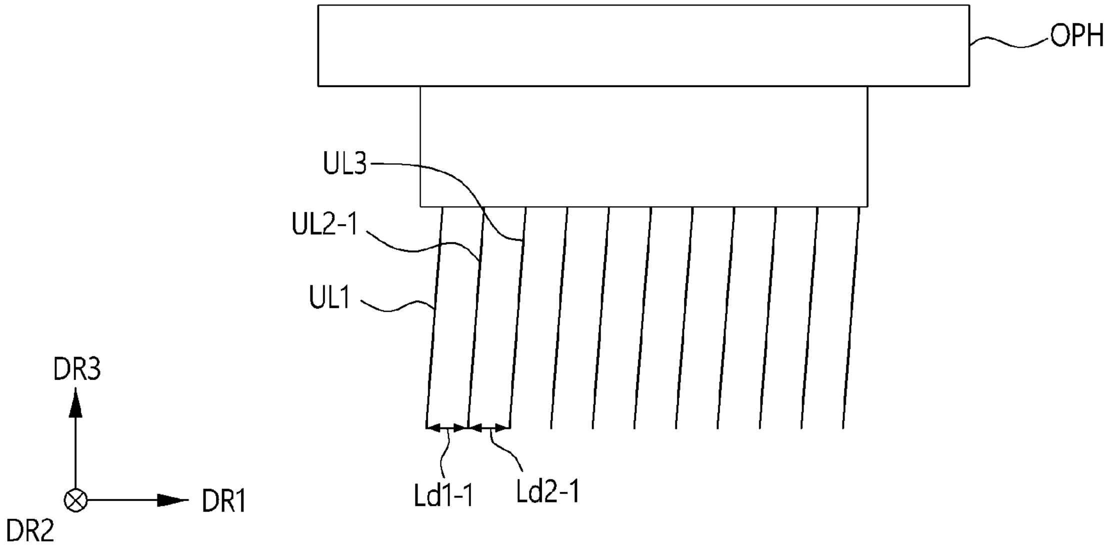
FIGS. 6A to 6C are side views illustrating states in which unit laser beams are emitted according to an embodiment.
Figure 6B:
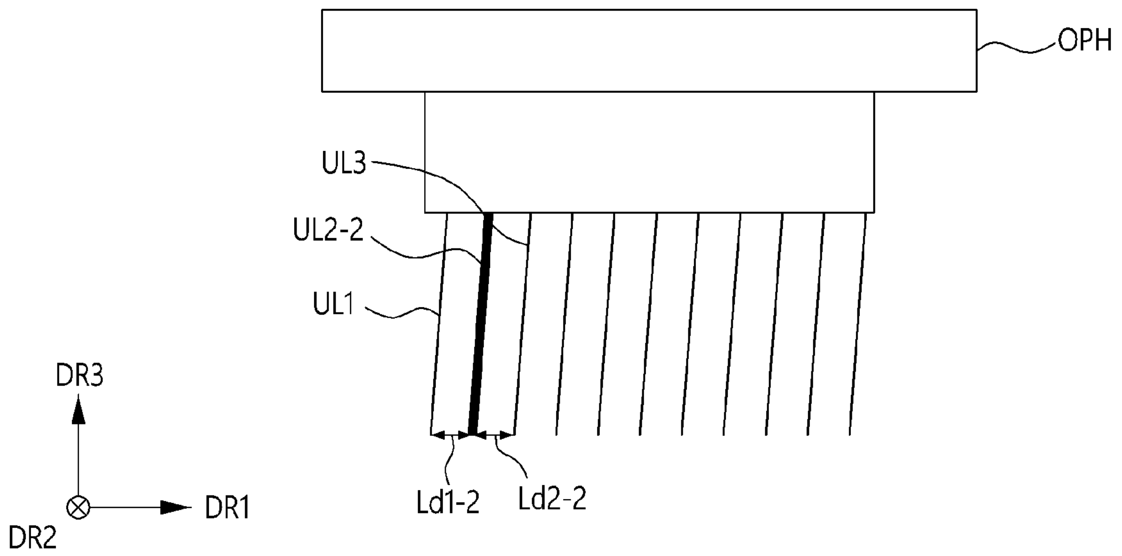
Figure 6C:
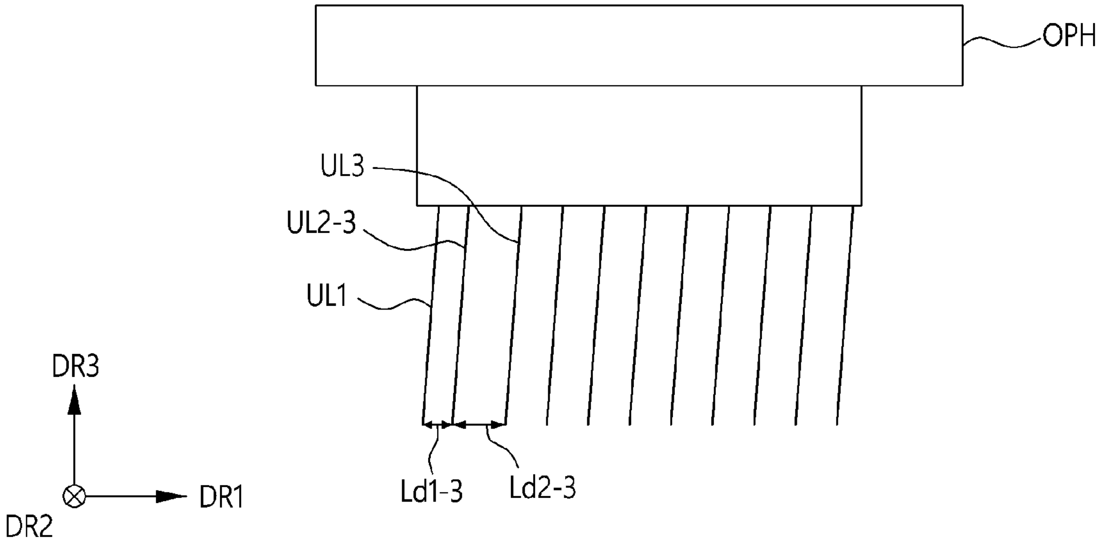

FIGS. 6A to 6C are side views illustrating states in which unit laser beams are emitted according to an embodiment.

FIGS. 7A to 7D are conceptual diagrams illustrating pulses of the unit laser beams of FIGS. 6A to 6C.

Referring to FIGS. 6A to 6C, states in which eleven unit laser beams are emitted from the optical head OPH are illustrated. FIG. 6A illustrates a case where all of the unit laser beams are emitted at the same interval and with the same intensity. FIG. 6B illustrates a case where the intensity of a second unit laser beam UL2-2 is greater than the intensities of other unit laser beams. FIG. 6C illustrates a case where a second unit laser beam UL2-3 is shifted to the second side in the first direction DR1, that is, to a left side in the drawing.

Generally, a plurality of unit laser beams UL may have the same intensity and interval. For example, as illustrated in FIG. 6A, a distance Ld1-1 between a first unit laser beam UL1 and a second unit laser beam UL2-1 may be the same as a distance Ld2-1 between the second unit laser beam UL2-1 and a third unit laser beam UL3. In addition, the intensities of the first through third unit laser beams UL1 through UL3 may be the same.

However, the intensity of a specific unit laser beam UL may also be different from the intensities of other unit laser beams UL, or the distances between the unit laser beams UL may be different.

For example, as illustrated in FIG. 6B, the intensity of a second unit laser beam UL2-2 may be greater than the intensities of a first unit laser beam UL1 and a third unit laser beam UL3. For another example, as illustrated in FIG. 6C, the position of a second unit laser beam UL2-3 may be shifted to the left in the drawing. Therefore, a distance Ld1-3 between the first unit laser beam UL1 and the second unit laser beam UL2-3 may be smaller than a distance Ld2-3 between the second unit laser beam UL2-3 and the third unit laser beam UL3.

Figure 7A:
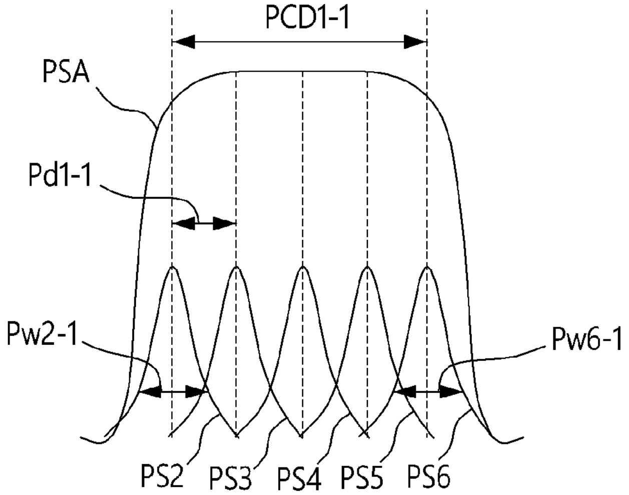
FIGS. 7A to 7D are conceptual diagrams illustrating pulses of the unit laser beams of FIGS. 6A to 6C.
Figure 7B:
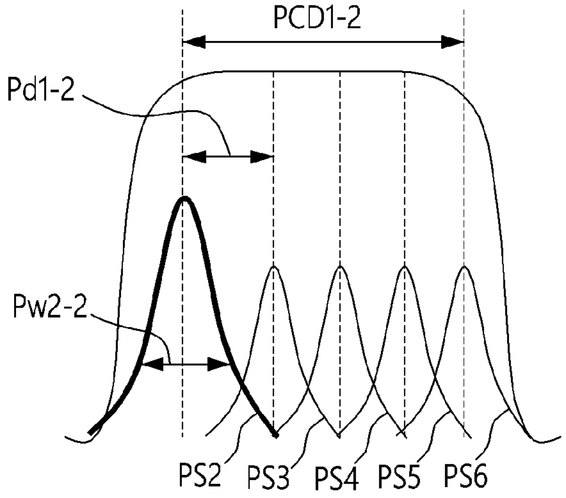
Figure 7C:
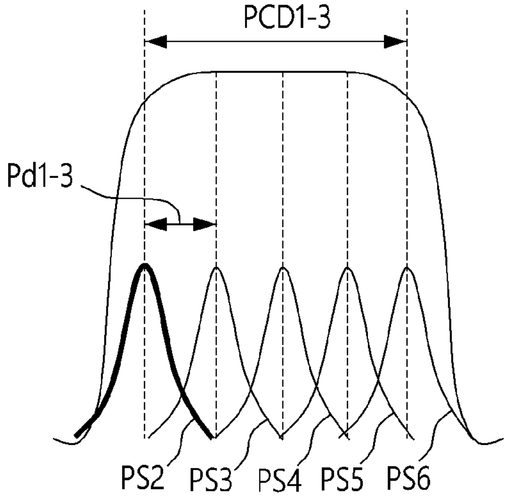
Figure 7D:
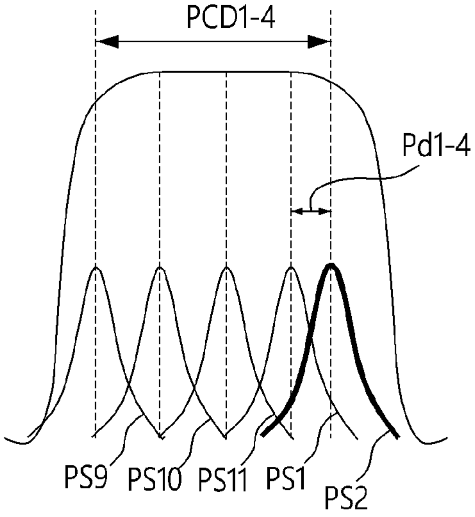

Referring to FIGS. 7A to 7D, pulses of unit laser beams in each case illustrated in FIGS. 6A to 6C are shown. FIG. 7A illustrates the pulses of the unit laser beams according to FIG. 6A, FIG. 7B illustrates the pulses of the unit laser beams according to FIG. 6B, and FIGS. 7C and 7D illustrate the pulses of the unit laser beams according to FIG. 6C. For ease of description, FIGS. 7A through 7C illustrate pulses PS2 through PS6 of second through sixth unit laser beams UL2 through UL6. FIG. 7D illustrates pulses PS9 through PS11 of ninth through eleventh unit laser beams UL9 through UL11, a pulse PS1 of a first unit laser beam UL1, and a pulse PS2 of a second unit laser beam UL2.

Referring to FIG. 7A, average widths Pw2-1 through Pw6-1 of the pulses PS2 through PS6 of the second through sixth unit laser beams UL2 through UL6 may all be the same. In addition, a distance Pd1-1 between a center of the pulse PS2 of the second unit laser beam UL2 and a center of the pulse PS3 of the third unit laser beam UL3 may be the same as a distance Pd between centers of the pulses PS of other unit laser beams UL.

A critical dimension PCD1-1 of a pulse PSA of a test pattern UPT formed by the second through sixth unit laser beams UL2 through UL6 may be determined by the pulses PS of the second unit laser beam UL2 and the sixth unit laser beam UL6 located at opposite ends.

Referring to FIG. 7B, an average width Pw2-2 of the pulse PS2 of the second unit laser beam UL2 may be greater than average widths Pw of the pulses PS of other unit laser beams UL. Accordingly, a distance Pd1-2 between the center of the pulse PS2 of the second unit laser beam UL2 and the center of the pulse PS3 of the third unit laser beam UL3 may be greater than the distance Pd between the centers of the pulses PS of other unit laser beams UL. Therefore, a critical dimension PCD1-2 of a pulse PSA of a test pattern UPT formed by the second through sixth unit laser beams UL2 through UL6 illustrated in FIG. 7B may be greater than the critical dimension PCD1-1 of the pulse PSA of the test pattern UPT illustrated in FIG. 7A.

Referring to FIG. 7C, a case where the second unit laser beam UL2 is located at a left end of a test pattern UPT is illustrated. Since the second unit laser beam UL2 is shifted to the left, a distance Pd1-3 between the center of the pulse PS2 of the second unit laser beam UL2 and the center of the pulse PS3 of the third unit laser beam UL3 may be greater than the distance Pd between the centers of the pulses PS of other unit laser beams UL.

Accordingly, a critical dimension PCD1-3 of a pulse PSA of a test pattern UPT formed by the second through sixth unit laser beams UL2 through UL6 may be greater than the critical dimension PCD1-1 of the pulse PSA of the test pattern UPT illustrated in FIG. 7A.

Referring to FIG. 7D, a case where the second unit laser beam UL2 is located at a right end of a test pattern UPT is illustrated. Since the second unit laser beam UL2 is shifted to the left, a distance Pd1-4 between the center of the pulse PS1 of the first unit laser beam UL1 and the center of the pulse PS2 of the second unit laser beam UL2 may be smaller than the distance Pd between the centers of the pulses PS of other unit laser beams UL.

Accordingly, a critical dimension PCD1-4 of a pulse PSA of a test pattern UPT formed by the ninth through eleventh unit laser beams UL9 through UL11, the first unit laser beam UL1, and the second unit laser beam UL2 may be smaller than the critical dimension PCD1-1 of the pulse PSA of the test pattern UPT illustrated in FIG. 7A.

A photomask according to an embodiment may include a monitoring mark for checking whether the intensities and intervals of a plurality of unit laser beams UL are the same as illustrated in FIGS. 6A and 7A.

Figure 8:
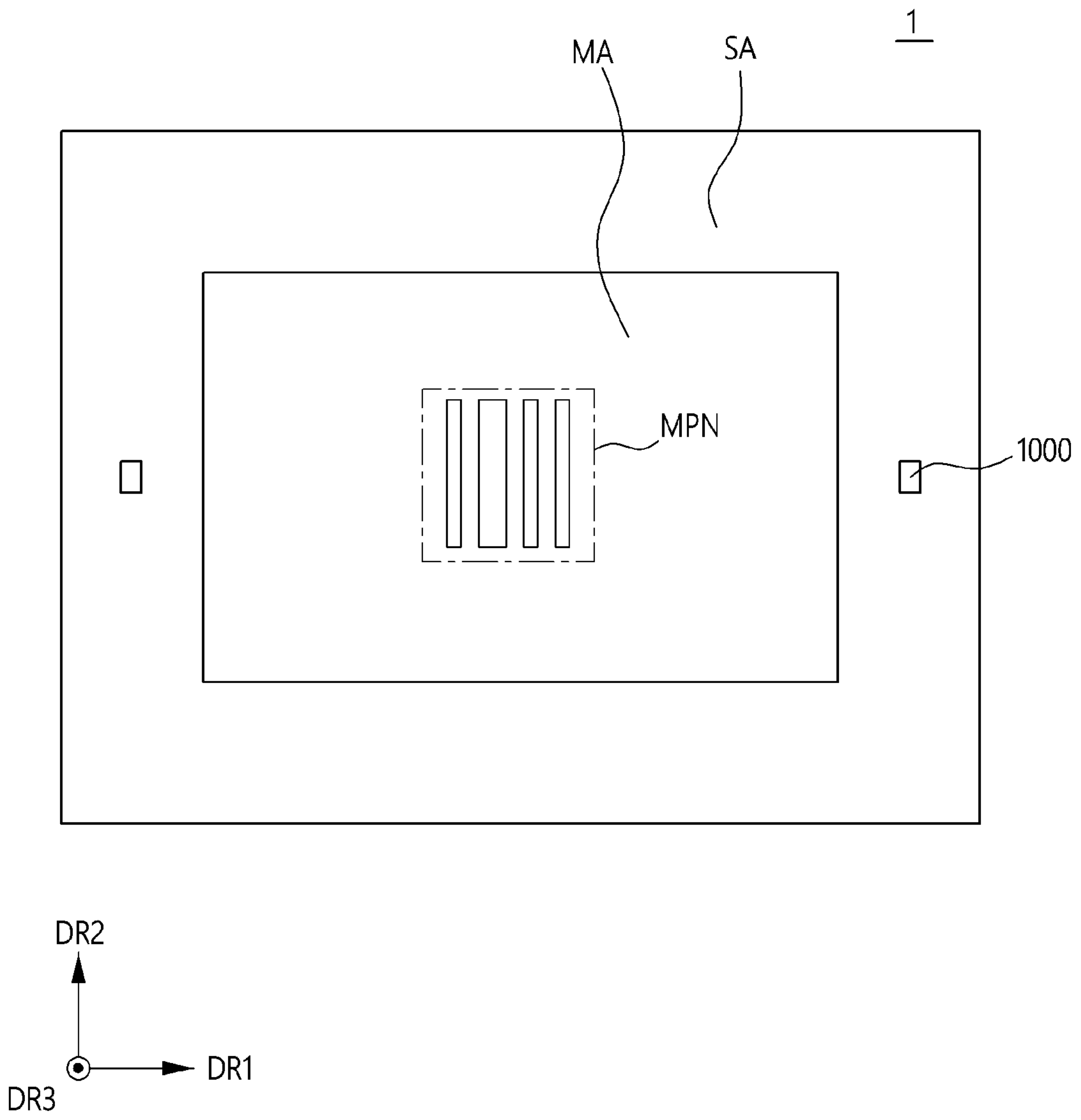
FIG. 8 is a plan view of a photomask including monitoring marks according to an embodiment.
Figure 9:
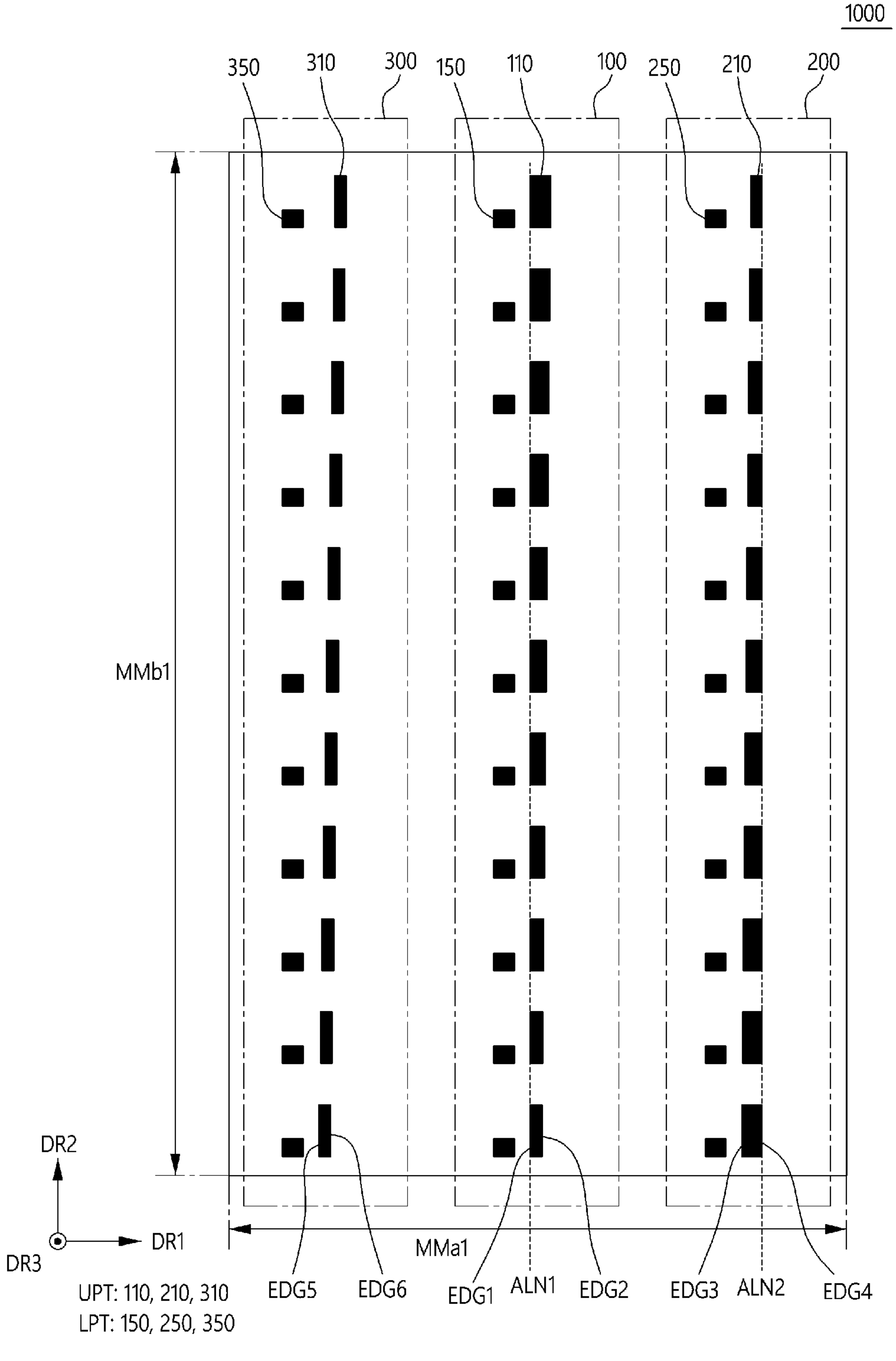
FIG. 9 is a plan view of a monitoring mark according to an embodiment.
Figure 10:
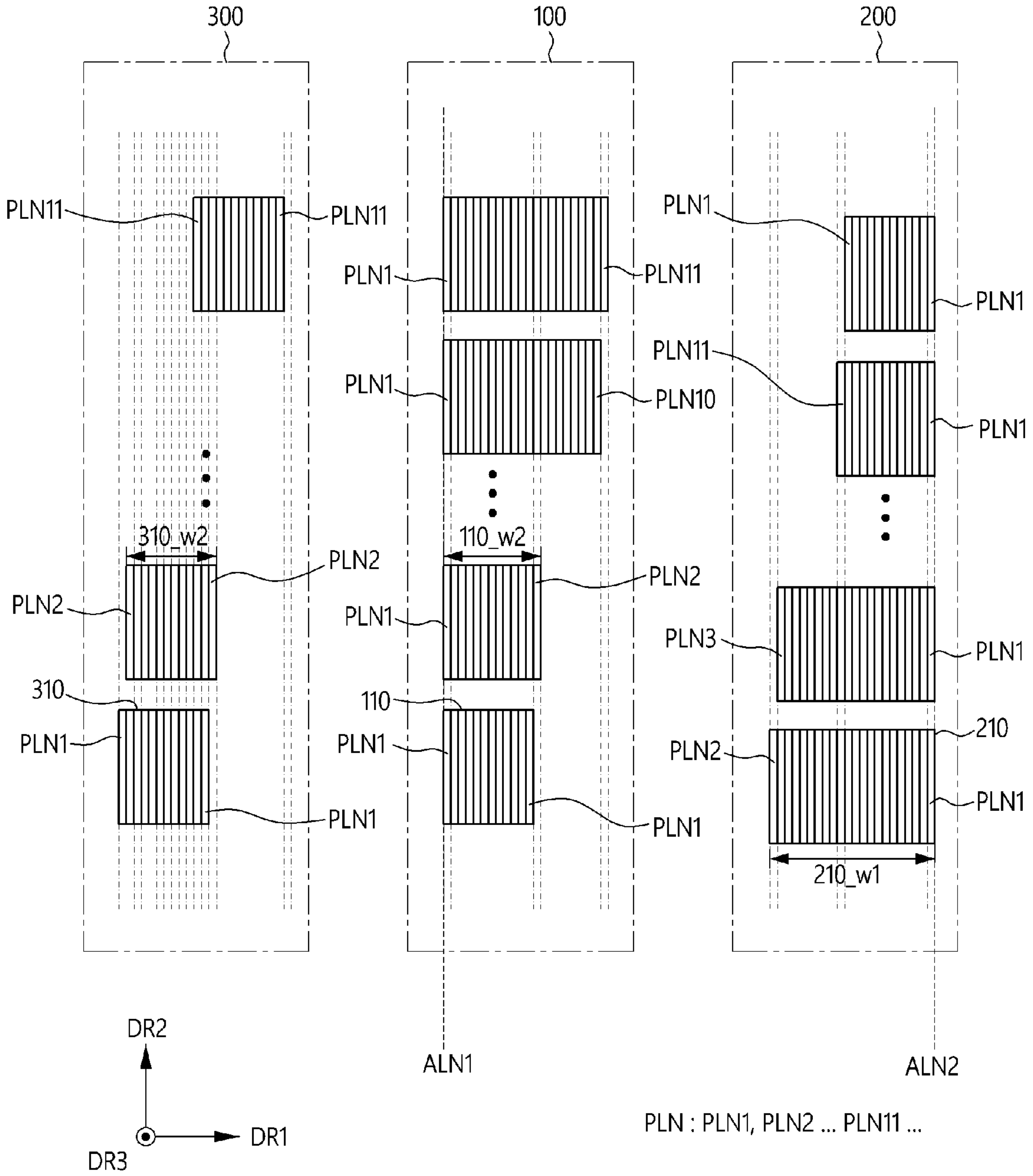
FIG. 10 is a conceptual diagram illustrating a process of forming the monitoring mark according to the embodiment.

FIG. 8 is a plan view of a photomask 1 including monitoring marks 1000 according to an embodiment. FIG. 9 is a plan view of a monitoring mark 1000 according to an embodiment. FIG. 10 is a conceptual diagram illustrating a process of forming the monitoring mark 1000 according to the embodiment. As used herein, the plan view is a view in the third direction DR3 (i.e., thickness direction of the photomask 1).

Referring to FIGS. 8 through 10, the photomask 1 according to the embodiment may include a main area MA and a peripheral area SA.

A main pattern MPN may be formed in the main area MA. The main pattern MPN may be a feature pattern to configure a circuit to be formed on a display panel DP (see FIG. 11) and may be a pattern to form a circuit pattern (not illustrated). In some embodiments, the main pattern MPN may be formed of a light blocking pattern such as chromium (Cr), a phase inversion pattern or a combination thereof or may be formed of an area limited by the light blocking pattern, the phase inversion pattern, or a combination thereof.

Figure 11:
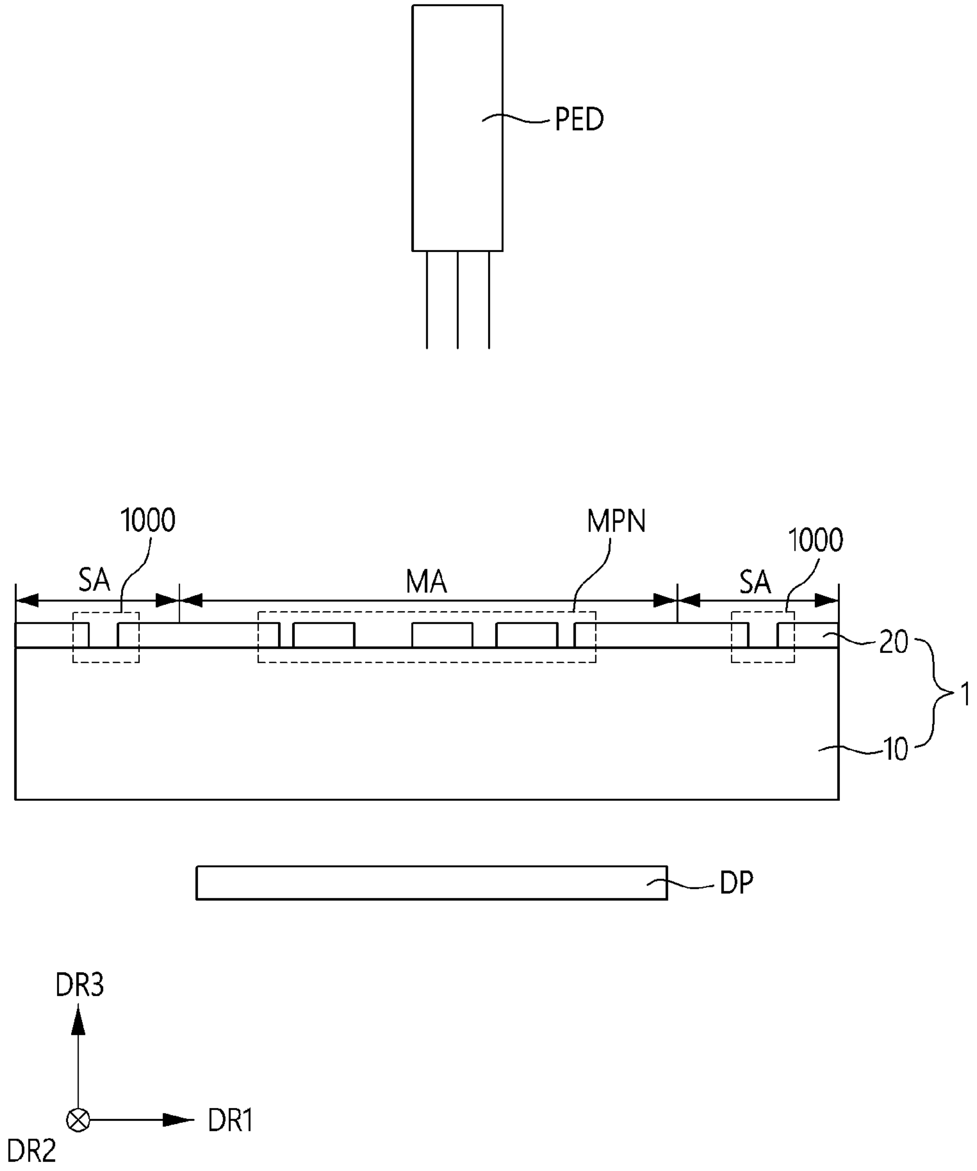
FIG. 11 is a side view illustrating a process of exposing a display panel to light using the photomask according to the embodiment.

In an embodiment, the size of the main area MA may be larger than a size of the display panel DP (see FIG. 11).

The peripheral area SA may be disposed outside the main area MA. In an embodiment, the peripheral area SA may surround the main area MA. However, the present disclosure is not limited thereto. In some embodiments, the peripheral area SA may also be disposed at a position spaced apart from the main pattern MPN within the main area MA.

A plurality of monitoring marks 1000 that may be formed at the same time as the main pattern MPN may be disposed in the peripheral area SA. Each of the monitoring marks 1000 may be formed of or include a light blocking pattern such as chromium (Cr), a phase inversion pattern or a combination thereof or may be formed of or include an area limited by the light blocking pattern, the phase inversion pattern, or a combination thereof.

The photomask 1 may include the monitoring marks 1000 disposed in the peripheral area SA. For example, as illustrated in FIG. 8, the photomask 1 may include the monitoring marks 1000 disposed on opposite sides of the main area MA.

The monitoring marks 1000 may function as test marks for monitoring the intensities and intervals of a plurality of unit laser beams UL.

In an embodiment, the monitoring marks 1000 may be rectangular. For example, a horizontal length MMa1 of each monitoring mark 1000 may be about 275 μm, and a vertical length MMb1 of each monitoring mark 1000 may be about 630 μm. However, the shape and size of each monitoring mark 1000 are not limited thereto.

Each of the monitoring marks 1000 may include a first sub-monitoring mark 100, a second sub-monitoring mark 200, and a third sub-monitoring mark 300, each including a plurality of test patterns UPT formed by laser beams. In an embodiment, the first sub-monitoring mark 100 may include a first test pattern group 110, the second sub-monitoring mark 200 may include a second test pattern group 210, and the third sub-monitoring mark 300 may include a third test pattern group 310.

The test patterns UPT may be defined as openings penetrating a base 10 and a pattern layer 20. Each of the test patterns UPT may include a first edge EDG1 and a second edge EDG2 extending along the second direction DR2 and facing each other along the first direction DR1. For example, in the drawings, left edges of a plurality of test patterns UPT included in the first test pattern group 110 may be the first edges EDG1, and right edges of the test patterns UPT may be the second edges EDG2. Left edges of a plurality of test patterns UPT included in the second test pattern group 210 may be third edges EDG3, and right edges of the test patterns UPT may be fourth edges EDG4. Left edges of a plurality of test patterns UPT included in the third test pattern group 310 may be fifth edges EDG5, and right edges of the test patterns UPT may be sixth edges EDG6.

Referring to FIG. 10, each of the test patterns UPT may be formed by a plurality of pattern lines PLN. That is, each of the test patterns UPT may consist of a plurality of pattern lines PLN. In an embodiment, the test patterns UPT may be rectangular. Each of the test patterns UPT may be formed in the shape of an opening by exposing and then developing unit areas UA engraved with the pattern lines PLN.

The pattern lines PLN refer to lines formed by exposure to unit laser beams UL, respectively, but do not necessarily refer to physically formed lines. For example, the pattern lines PLN may also refer to virtual lines through which the unit laser beams UL pass.

The pattern lines PLN may be located in the unit areas UA, respectively. For example, first through $n^{th}$ pattern lines PLN1 through PLNn may be formed by first through $n^{th}$ unit laser beams UL1 through ULn, respectively, and may be formed in first through $n^{th}$ unit areas UA1 through UAn, respectively. For ease of description, a case where n is 11 will be described below as an example.

In an embodiment, the first through $n^{th}$ pattern lines PLN1 through PLNn may be sequentially disposed. After the $n^{th}$ pattern line PLNn is disposed, the first pattern line PLN1 may be disposed again to be adjacent to the $n^{th}$ pattern line PLNn.

The pattern lines PLN may each have the same width as each of the unit laser beams UL and the unit areas UA. For example, the width of each of the pattern lines PLN may be about 0.25 μm or about 0.35 μm.

In the first test pattern group 110 composed of a plurality of test patterns UPT included in the first sub-monitoring mark 100, a left end of each of the test patterns UPT in the first test pattern group 110 may be formed by an $i^{th}$ pattern line PLNi, and a right end of each of the test patterns UPT in the first test pattern group 110 may be formed by an $(i+j-1)^{th}$ pattern line PLN (where i is one of natural numbers from 1 to n, and j is any natural number from 1 to n). For example, as illustrated in FIG. 10, when i is 1 and n is 11, the first test pattern group 110 may include a test pattern UPT having left and right ends formed by a first pattern line PLN1 and the first pattern line PLN1, respectively, a test pattern UPT having left and right ends formed by the first pattern line PLN1 and a second pattern line PLN2, respectively, a test pattern UPT having left and right ends formed by the first pattern line PLN1 and a tenth pattern line PLN10, respectively, and a test pattern UPT having left and right ends formed by the first pattern line PLN1 and an eleventh pattern line PLN11, respectively.

In an embodiment, the second edge EDG2 of a $j^{th}$ test pattern (where j is any natural number from 1 to n) among the first through $n^{th}$ test patterns (where n is one of natural numbers) included in the first test pattern group 110 may be spaced apart from the first edge EDG1 of the $j^{th}$ test pattern along the first direction DR1 by (kn+j) times (where k is one of natural numbers) the width of a unit area UA.

In an embodiment, each of the test patterns UPT included in the first test pattern group 110 may have a width (kn+j) times (where k is one of natural numbers) the width of a unit area UA. For example, when k is 1 and n is 11, each of the test patterns UPT included in the first test pattern group 110 may have a width 12 to 22 times the width of a unit area UA.

In an embodiment, the test patterns UPT included in the first test pattern group 110 may be arranged along the second direction DR2, and the first edges EDG1 of the first test pattern group 110 may be aligned along a first alignment line ALN1 extending along the second direction DR2. For example, the first edges EDG1 of the test patterns UPT included in the first test pattern group 110 may be aligned with each other.

In an embodiment, the second edge EDG2 of an $i^{th}$ test pattern (where i is a natural number from 1 to n−1) among the test patterns UPT included in the first test pattern group 110 may overlap an $(i+1)^{th}$ test pattern along the second direction DR2. For example, the second edge EDG2 of a lowermost test pattern UPT in the drawings among the test patterns UPT included in the first test pattern group 110 may overlap a test pattern UPT located immediately above the lowermost test pattern UPT in the second direction DR2.

According to the photomask 1 including the monitoring marks 1000 according to the current embodiment, when the intensity of a specific unit laser beam UL is changed or when the specific unit laser beam UL is out of position, this may be monitored through a test pattern UPT, on which the specific unit laser beam UL is placed, at the right end of the first test pattern group 110.

More specifically, a case where the intensity and position of the second unit laser beam UL2 are changed as in the examples of FIGS. 6 and 7 described above will be described as an example.

As illustrated in FIG. 10, in the first test pattern group 110, a width 110_*w*2 of a test pattern UPT having a left side formed by the first pattern line PLN1 and a right side formed by the second pattern line PLN2 may be 13 times the width of a unit area UA. If the width 110_*w*2 of the test pattern UPT is smaller than 13 times the width of the unit area UA, the second unit laser beam UL2 may have been shifted to the left, or the intensity of the second unit laser beam UL2 may have been reduced. If the width 110_*w*2 of the test pattern UPT is greater than 13 times the width of the unit area UA, the second unit laser beam UL2 may have been shifted to the right, or the intensity of the second unit laser beam UL2 may have been increased.

Therefore, according to the photomask 1 including the monitoring marks 1000 which include the first test pattern group 110 according to the current embodiment, the intensity and position of a $j^{th}$ unit laser beam ULj (where j is any natural number from 1 to n) may be monitored by emitting a fixed $i^{h}$ unit laser beam ULi (where i is one of natural numbers from 1 to n) to the left end of the first test pattern group 110 and then emitting the $j^{th}$ unit laser beam ULj to the right end of the first test pattern group 110.

In some embodiments, as illustrated in FIG. 10, the first test pattern group 110 may be formed by j+n successive pattern lines PLN (where j is any natural number from 1 to n) starting from an $i^{th}$ pattern line PLNi (where i is one of natural numbers from 1 to n). For example, when i is 1 and n is 11, the first test pattern group 110 may include test patterns UPT, each formed by 12 to 22 successive pattern lines PLN starting from the first pattern line PLN1.

In the second test pattern group 210 composed of a plurality of test patterns UPT included in the second sub-monitoring mark 200, a right end of the second test pattern group 210 may be formed by an $i^{th}$ pattern line PLNi, and a left end of the second test pattern group 210 may be formed by an $(i+j-1)^{th}$ pattern line PLN (where i is one of natural numbers from 1 to n, and j is any natural number from 1 to n). For example, as illustrated in FIG. 10, when i is 1 and n is 11, the second test pattern group 210 may include a test pattern UPT having left and right ends formed by a first pattern line PLN1 and the first pattern line PLN1, respectively, a test pattern UPT having left and right ends formed by an eleventh pattern line PLN11 and the first pattern line PLN1, respectively, a test pattern UPT having left and right ends formed by a third pattern line PLN3 and the first pattern line PLN1, respectively, and a test pattern UPT having left and right ends formed by a second pattern line PLN2 and the first pattern line PLN1, respectively.

In an embodiment, the third edge EDG3 of a $p^{th}$ test pattern (where p is any natural number from 1 to m) among the first through $m^{th}$ test patterns (where m is one of natural numbers) included in the second test pattern group 210 may be spaced apart from the fourth edge EDG4 of the $p^{th}$ test pattern along the first direction DR1 by (qm+p) times (where q is one of natural numbers) the width of a unit area UA.

In an embodiment, each of the test patterns UPT included in the second test pattern group 210 may have a width (qm+p) times the width of a unit area UA. For example, when q is 1 and m is 11, each of the test patterns UPT included in the second test pattern group 210 may have a width 12 to 22 times the width of a unit area UA.

In an embodiment, the test patterns UPT included in the second test pattern group 210 may be arranged along the second direction DR2, and the fourth edges EDG4 of the second test pattern group 210 may be aligned along a second alignment line ALN2 extending along the second direction DR2. For example, the fourth edges EDG4 of the test patterns UPT included in the second test pattern group 210 may be aligned with each other.

According to the photomask 1 including the monitoring marks 1000 according to the current embodiment, when the intensity of a specific unit laser beam UL is changed or when the specific unit laser beam UL is out of position, this may be monitored through a test pattern UPT, on which the specific unit laser beam UL is placed, at the left end of the second test pattern group 210.

More specifically, a case where the intensity and position of the second unit laser beam UL2 are changed as in the examples of FIGS. 6 and 7 described above will be described as an example.

As illustrated in FIG. 10, in the second test pattern group 210, a width 210_*w*1 of a test pattern UPT having a right side formed by the first pattern line PLN1 and a left side formed by the second pattern line PLN2 may be 22 times the width of a unit area UA. If the width 210_*w*1 of the test pattern UPT is smaller than 22 times the width of the unit area UA, the second unit laser beam UL2 may have been shifted to the right, or the intensity of the second unit laser beam UL2 may have been reduced. If the width 210_*w*1 of the test pattern UPT is greater than 22 times the width of the unit area UA, the second unit laser beam UL2 may have been shifted to the left, or the intensity of the second unit laser beam UL2 may have been increased.

Therefore, according to the photomask 1 including the monitoring marks 1000 which include the second test pattern group 210 according to the current embodiment, the intensity and position of a $j^{th}$ unit laser beam ULj may be monitored by emitting a fixed $i^{th}$ unit laser beam ULi to the right end of the second test pattern group 210 and then emitting the $j^{th}$ unit laser beam ULj to the left end of the second test pattern group 210.

In some embodiments, as illustrated in FIG. 10, the second test pattern group 210 may include test patterns UPT, each formed by j+n successive pattern lines PLN (where j is any natural number from 1 to n), but the last test pattern UPT may be formed by $i^{th}$ pattern line PLNi. For example, when i is 1 and n is 11, the second test pattern group 210 may include test patterns UPT, each formed by 12 to 22 successive pattern lines PLN, but the last test pattern UPT may be formed by the first pattern line PLN1.

In some embodiments, a direction from the fourth edges EDG4 to the third edges EDG3 of the test patterns UPT included in the second test pattern group 210 may be opposite to a direction from the first edges EDG1 to the second edges EDG2 of the test patterns UPT included in the first test pattern group 110. In addition, the second sub-monitoring mark 200 may be point-symmetric to the first sub-monitoring mark 100. Accordingly, whether a unit laser beam UL is out of position can be identified in opposite directions through the first sub-monitoring mark 100 and the second sub-monitoring mark 200.

In the third test pattern group 310 composed of a plurality of test patterns UPT included in the third sub-monitoring mark 300, a left end of the third test pattern group 310 may be formed by a $j^{th}$ pattern line PLNj, and a right end of the third test pattern group 310 may also be formed by the same $j^{th}$ pattern line PLNj (where j is any natural number from 1 to n). For example, as illustrated in FIG. 10, the third test pattern group 310 may include a test pattern UPT having left and right ends formed by a first pattern line PLN1 and the first pattern line PLN1, respectively, a test pattern UPT having left and right ends formed by a second pattern line PLN2 and the second pattern line PLN2, respectively, and a test pattern UPT having left and right ends formed by an eleventh pattern line PLN11 and the eleventh pattern line PLN11, respectively.

In an embodiment, the fifth edge EDG5 of an $i^{th}$ test pattern (where i is any natural number from 2 to n) among the first through $n^{th}$ test patterns (where n is one of natural numbers) included in the third test pattern group 310 may be spaced apart from the fifth edge EDG5 of an $(i-1)^{th}$ test pattern along the first direction DR1 by the width of a unit area UA.

In an embodiment, the sixth edges EDG6 of the first through $n^{th}$ test patterns included in the third test pattern group 310 may be respectively spaced apart from the fifth edges EDG5 of the first through $n^{h}$ test patterns along the first direction DR1 by (kn+1) times (where k is one of natural numbers) the width of a unit area UA.

In an embodiment, each of the test patterns UPT included in the third test pattern group 310 may have a width (kn+1) times the width of a unit area UA. For example, when k is 1 and n is 11, each of the test patterns UPT included in the third test pattern group 310 may have a width 12 times the width of a unit area UA.

In an embodiment, the test patterns UPT included in the third test pattern group 310 may be arranged along a direction inclined to the first direction DR1 and the second direction DR2. The fifth edges EDG5 of the test patterns UPT included in the third test pattern group 310 may not overlap each other along the second direction DR2.

In an embodiment, the fifth edge EDG5 of the $i^{th}$ test pattern (where i is any natural number from 2 to n) among the test patterns UPT included in the third test pattern group 310 may overlap the $(i-1)^{th}$ test pattern along the second direction DR2.

According to the photomask 1 including the monitoring marks 1000 according to the current embodiment, when the intensity of a specific unit laser beam UL is changed, this may be monitored through test patterns UPT, on which the specific unit laser beam UL is placed, at opposite ends of the third test pattern group 310.

More specifically, a case where the intensity of the second unit laser beam UL2 is changed as in the examples of FIGS. 6 and 7 described above will be described as an example.

As illustrated in FIG. 10, in the third test pattern group 310, a width 310_*w*2 of a test pattern UPT having opposite sides formed by the second pattern lines PLN2 may be 12 times the width of a unit area UA. If the width 310_*w*2 of the test pattern UPT is smaller than 12 times the width of the unit area UA, the intensity of the second unit laser beam UL2 may have been reduced. If the width 310_*w*2 of the test pattern UPT is greater than 12 times the width of the unit area UA, the intensity of the second unit laser beam UL2 may have been increased.

Therefore, according to the photomask 1 including the monitoring marks 1000 which include the third test pattern group 310 according to the current embodiment, the intensity of a $j^{th}$ unit laser beam ULj may be monitored by emitting the $j^{th}$ unit laser beam ULj to opposite ends of the third test pattern group 310.

Each of the first through third sub-monitoring marks 100, 200 and 300 may further include a plurality of position patterns LPT configured to monitor position information of each of the test patterns UPT. In an embodiment, the first sub-monitoring mark 100 may further include first position patterns 150, the second sub-monitoring mark 200 may further include second position patterns 250, and the third sub-monitoring mark 300 may further include third position patterns 350.

Each of the position patterns LPT may be disposed on one side of one of the test patterns UPT. In an embodiment, the first position patterns 150 may be disposed on one side of the first test pattern group 110, the second position patterns 250 may be disposed on one side of the second test pattern group 210, and the third position patterns 350 may be disposed on one side of the third test pattern group 310.

FIG. 11 is a side view illustrating a process of exposing the display panel DP to light using the photomask 1 according to the embodiment.

Referring to FIG. 11, the display panel DP may be exposed to light using the photomask 1 according to the embodiment.

The photomask 1 may include the base 10 and the pattern layer 20 disposed on the base 10 as described above. The photomask 1 may include the main area MA and the peripheral area SA. The photomask 1 may include the main pattern MPN disposed in the main area MA and the monitoring marks 1000 disposed in the peripheral area SA. Opening areas formed in the main pattern MPN and the monitoring marks 1000 may allow light emitted from a display panel exposure device PED to pass therethrough.

The photomask 1 may be disposed on the display panel DP. For example, the photomask 1 may be disposed above the display panel DP.

The display panel exposure device PED may be located on the opposite side of the photomask 1 from the display panel DP. The display panel exposure device PED may be a known display panel exposure device configured to expose the display panel DP using the photomask 1. For example, the display panel exposure device PED may be a stepper type or scan type exposure device depending on an operation method and may be an excimer laser, gas laser, solid-state laser or semiconductor laser exposure device depending on the type of light source.

The display panel DP may include a pattern area (not illustrated) where a circuit pattern is formed.

In an embodiment, the display panel DP may overlap the main area MA of the photomask 1 but may not overlap the peripheral area SA in a plan view. In an embodiment, the display panel DP may overlap the peripheral area SA but may not overlap the monitoring marks 1000 in a plan view. In an embodiment, even if a portion of the display panel DP overlaps the monitoring marks 1000, the pattern area of the display panel DP may not overlap the monitoring marks 1000 in a plan view.

By placing the pattern area of the display panel DP, which needs to be exposed, not to overlap the monitoring marks 1000 of the photomask 1 in a plan view when the display panel DP is exposed using the photomask 1 according to the current embodiment, it is possible to prevent unnecessary patterns from being formed on the display panel DP by light passing through the monitoring marks 1000.

Other embodiments of the photomask 1 including the monitoring marks 1000 according to the embodiment will now be described. In the following embodiments, the same elements as those of the above-described embodiment will be indicated by the same reference numerals, and their redundant description will be omitted or given briefly, and differences will be mainly described.

Figure 12:
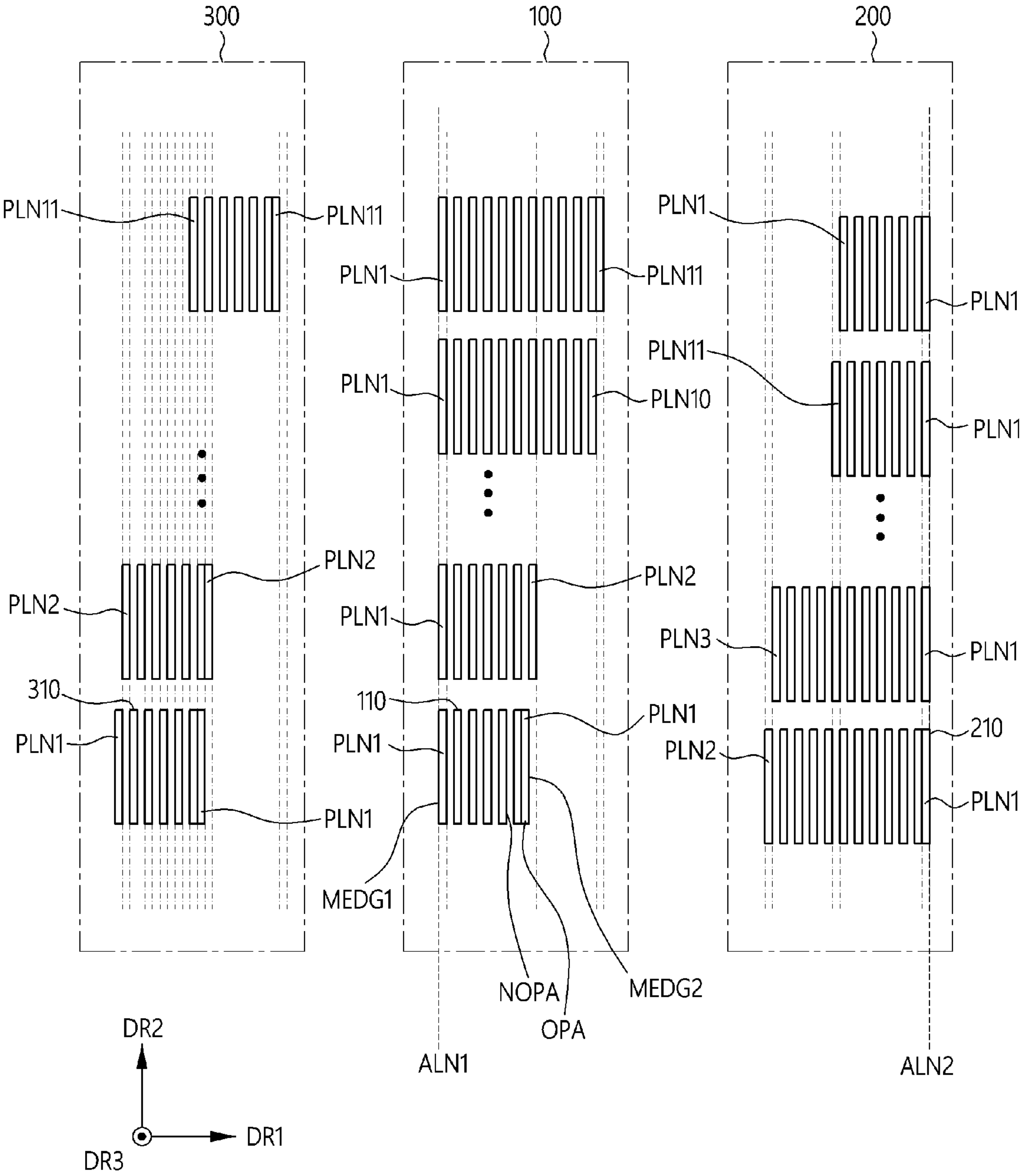
FIG. 12 is a conceptual diagram illustrating a process of forming a monitoring mark according to another embodiment.

FIG. 12 is a conceptual diagram illustrating a process of forming a monitoring mark 1000 according to an embodiment.

Referring to FIG. 12, the monitoring mark 1000 according to the current embodiment is different from the monitoring mark 1000 according to the embodiment described above with reference to FIG. 10 in that each test pattern UPT included in first through third test pattern groups 110, 210 and 310 includes a plurality of openings OPA and a plurality of masking areas NOPA disposed alternately along the first direction DR1.

More specifically, in the monitoring mark 1000 according to the current embodiment, each of the test patterns UPT included in the first through third test pattern groups 110, 210 and 310 may include a plurality of openings OPA and a plurality of masking areas NOPA disposed alternately along the first direction DR1.

Each of the test patterns UPT included in the first through third test pattern groups 110, 210 and 310 may include a first outermost boundary MEDG1 and a second outermost boundary MEDG2 located at opposite outermost positions in the first direction DR1 and facing each other among a plurality of boundaries formed between the openings OPA and the masking areas NOPA.

A distance between the first outermost boundary MEDG1 and the second outermost boundary MEDG2 in each of the test patterns UPT included in the first through third test pattern groups 110, 210 and 310 is the same as the distance between the first edge EDG1 and the second edge EDG2, the distance between the third edge EDG3 and the fourth edge EDG4, and the distance between the fifth edge EDG5 and the sixth edge EDG6 described above, and thus a description thereof will be omitted.

In some embodiments, each of the test patterns UPT included in the first through third test pattern groups 110, 210 and 310 may include at least one masking area NOPA in which an opening is not formed between the first outermost boundary MEDG1 and the second outermost boundary MEDG2.

For example, as illustrated in FIG. 12, the first through third test pattern groups 110, 210 and 310 may be formed not by successive pattern lines PLN, but by non-successive pattern lines PLN. That is, as long as the distance between the first outermost boundary MEDG1 and the second outermost boundary MEDG2 in the first direction DR1 is the same as corresponding one of the distance between the first edge EDG1 and the second edge EDG2, the distance between the third edge EDG3 and the fourth edge EDG4, and the distance between the fifth edge EDG5 and the sixth edge EDG6 described above, openings located between them can be non-successive. In an embodiment, the number of the pattern lines PLN in one test pattern UPT in this embodiment may be less than the number of the pattern lines PLN in a corresponding test pattern UPT in the embodiment of FIG. 10.

Figure 13:
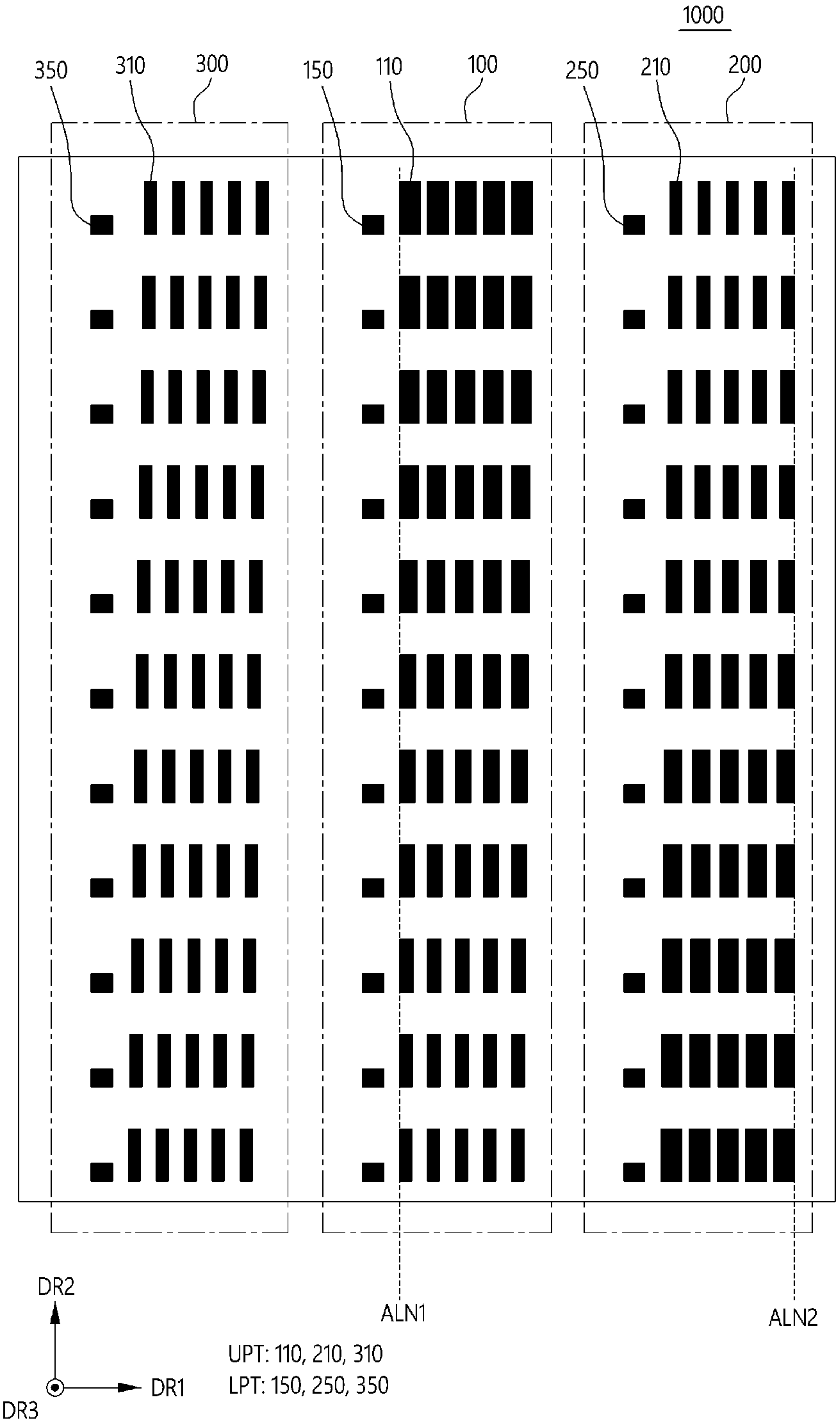
FIG. 13 is a plan view of a monitoring mark according to another embodiment.

FIG. 13 is a plan view of a monitoring mark 1000 according to an embodiment.

Referring to FIG. 13, the monitoring mark 1000 according to the current embodiment is different from the monitoring mark 1000 according to the embodiment described above with reference to FIG. 9 in that a plurality of test patterns UPT are formed in the first direction DR1 in each row of each of first through third test pattern groups 110, 210, and 310.

More specifically, a plurality of test patterns UPT may be formed along the first direction DR1 in each row of each of the first through third test pattern groups 110, 210 and 310. For example, as illustrated in the drawing, five identical test patterns UPT may be arranged along the first direction DR1 in each row of each of the first through third test pattern groups 110, 210 and 310. However, the number of identical test patterns UPT is not limited thereto.

Since a photomask 1 including the monitoring mark 1000 according to the current embodiment includes a plurality of identical test patterns UPT as described above, monitoring accuracy can be effectively improved.

Figure 14:
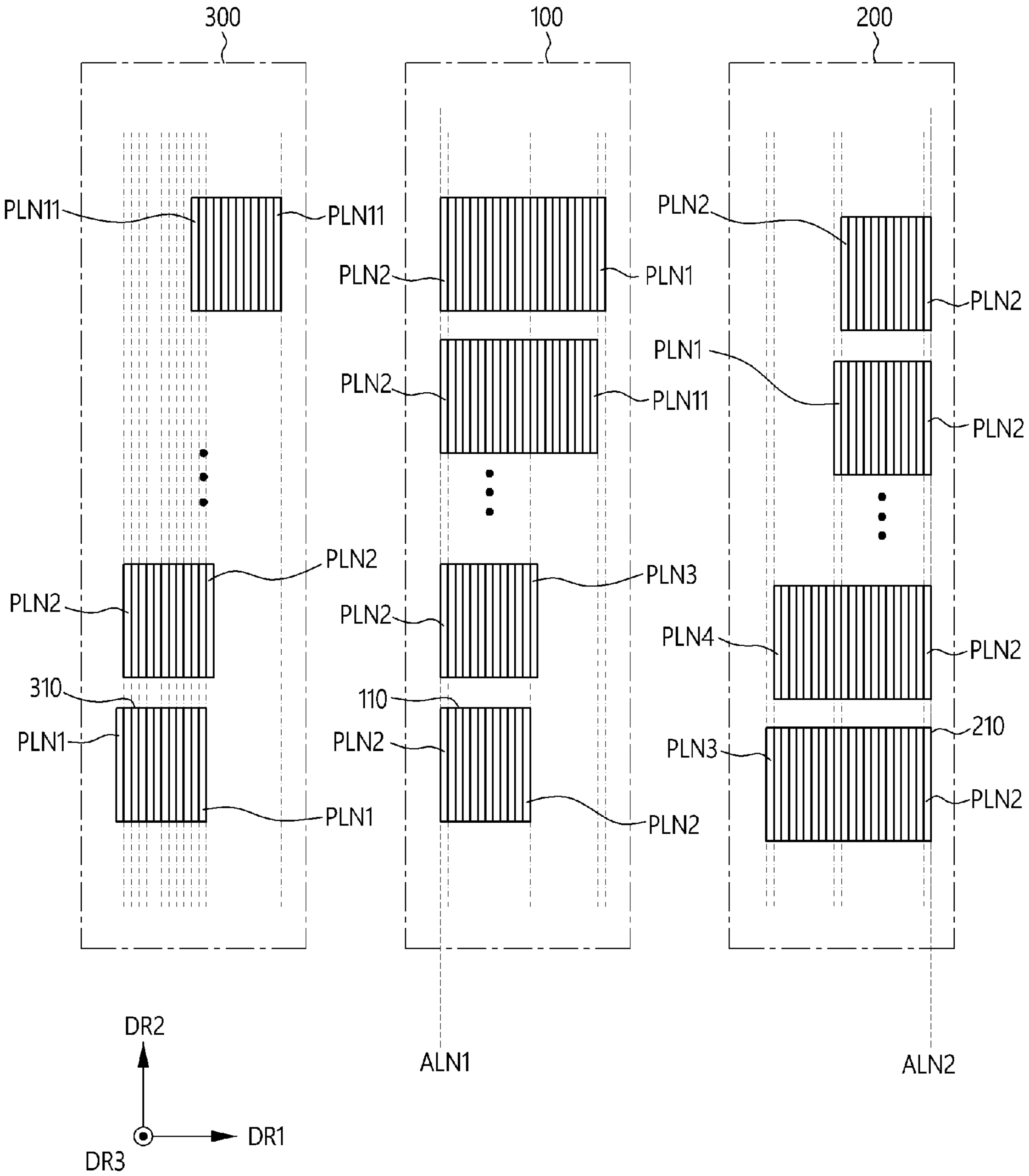
FIG. 14 is a conceptual diagram illustrating a process of forming a monitoring mark according to still another embodiment.

FIG. 14 is a conceptual diagram illustrating a process of forming a monitoring mark 1000 according to an embodiment.

Referring to FIG. 14, the monitoring mark 1000 according to the current embodiment is different from the monitoring mark 1000 according to the embodiment described above with reference to FIG. 10 in that a left end of a first test pattern group 110 included in a first sub-monitoring mark 100 and a right end of a second test pattern group 210 included in a second sub-monitoring mark 200 are formed by second pattern lines PLN2.

More specifically, the first test pattern group 110 composed of test patterns UPT included in the first sub-monitoring mark 100 according to the current embodiment is the same as that of the monitoring mark 1000 according to the embodiment described above with reference to FIG. 10 in that the left end of the first test pattern group 110 is formed by an $i^{th}$ pattern line PLNi and a right end of the first test pattern group 110 is formed by an $(i+j-1)^{th}$ pattern line PLN (where i is one of natural numbers from 1 to n, and j is any natural number from 1 to n).

However, the two embodiments are different in that i is 2 as illustrated in FIG. 14, unlike in FIG. 10. For example, the first test pattern group 110 may include a test pattern UPT having left and right ends formed by a second pattern line PLN2 and the second pattern line PLN2, respectively, a test pattern UPT having left and right ends formed by the second pattern line PLN2 and a third pattern line PLN3, respectively, a test pattern UPT having left and right ends formed by the second pattern line PLN2 and an eleventh pattern line PLN11, respectively, and a test pattern UPT having left and right ends formed by the second pattern line PLN2 and a first pattern line PLN1, respectively.

In addition, a second test pattern group 210 composed of test patterns UPT included in the second sub-monitoring mark 200 is the same as that of the monitoring mark 1000 according to the embodiment described above with reference to FIG. 10 in that the right end of the second test pattern group 210 is formed by an $i^{th}$ pattern line PLNi and the left end of the second test pattern group 210 is formed by an $(i+j-1)^{th}$ pattern line PLN (where i is one of natural numbers from 1 to n, and j is any natural number from 1 to n).

However, the two embodiments are different in that i is 2 as illustrated in FIG. 14, unlike in FIG. 10. For example, the second test pattern group 210 may include a test pattern UPT having left and right ends formed by a second pattern line PLN2 and the second pattern line PLN2, respectively, a test pattern UPT having left and right ends formed by a first pattern line PLN1 and the second pattern line PLN2, respectively, a test pattern UPT having left and right ends formed by a fourth pattern line PNL4 and the second pattern line PLN2, respectively, and a test pattern UPT having left and right ends formed by a third pattern line PLN3 and the second pattern line PLN2, respectively.

Figure 15:
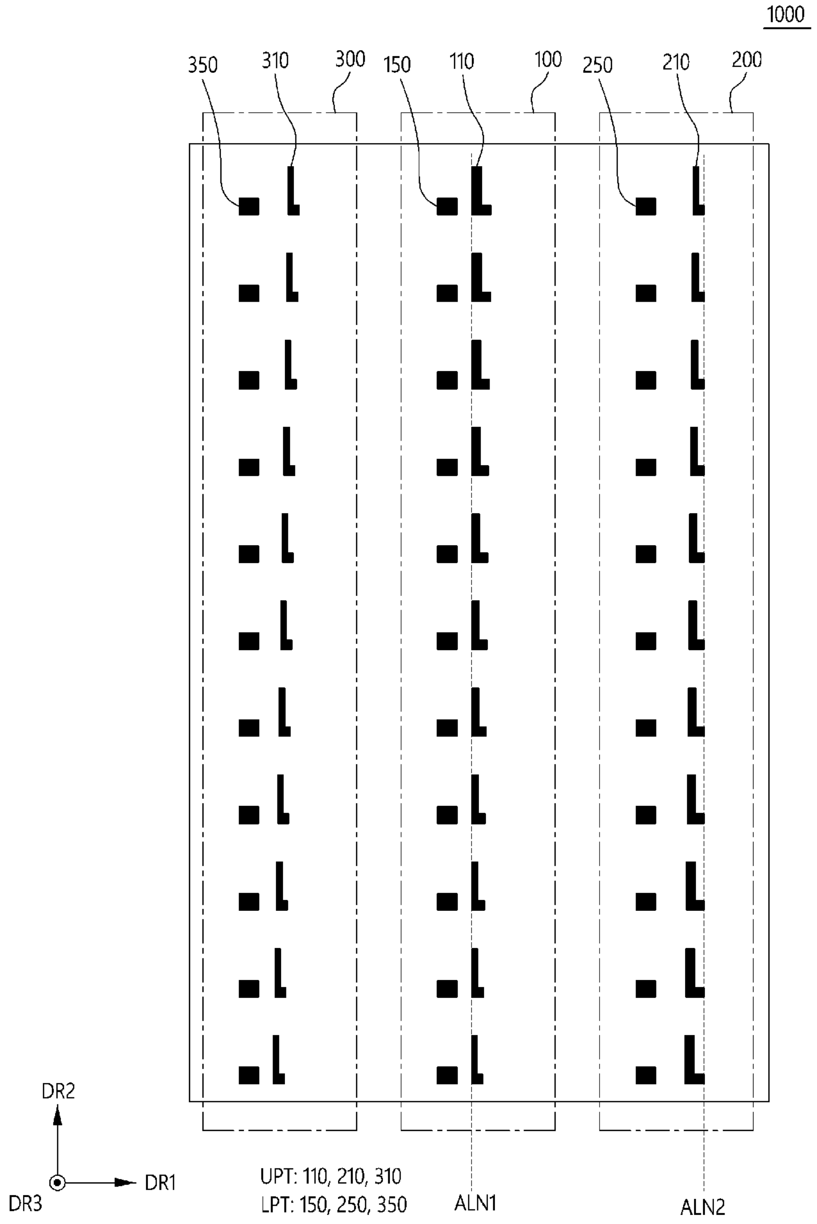
FIG. 15 is a plan view of a monitoring mark according to still another embodiment.

FIG. 15 is a plan view of a monitoring mark 1000 according to an embodiment.

Referring to FIG. 15, the monitoring mark 1000 according to the current embodiment is different from the monitoring mark 1000 according to the embodiment described above with reference to FIG. 9 in the shape of a plurality of test patterns UPT.

More specifically, the test patterns UPT according to the current embodiment may have an 'L' shape. However, the present disclosure is not limited thereto. In some embodiments, the shape of the test patterns UPT may be variously modified. For example, the test patterns UPT may have the same shape as a portion of a main pattern MPN (see FIG. 8).

When the test patterns UPT are formed to have the same shape as the main pattern MPN (see FIG. 8), monitoring can be performed under critical dimension conditions similar to those of the main pattern MPN (see FIG. 8), and monitoring accuracy can be improved.

Figure 16:
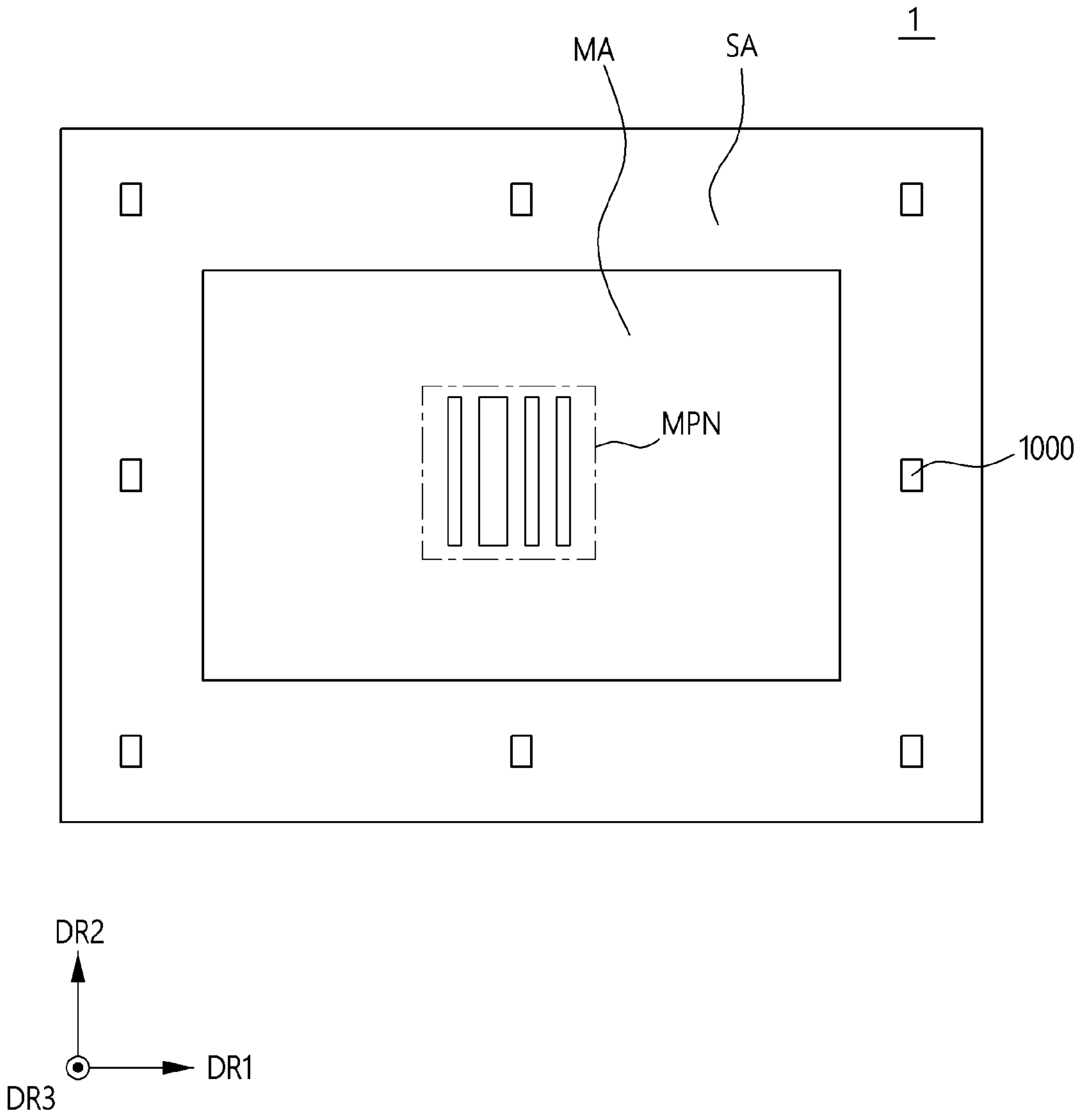
FIG. 16 is a plan view of a photomask including monitoring marks according to an embodiment.

FIG. 16 is a plan view of a photomask 1 including monitoring marks 1000 according to an embodiment.

Referring to FIG. 16, the photomask 1 according to the current embodiment is different in the position and number of monitoring marks 1000 from the photomask 1 including the monitoring marks 1000 according to the embodiment described above with reference to FIG. 8.

More specifically, the photomask 1 according to the current embodiment may include the monitoring marks 1000 disposed adjacent to four vertices and four sides. However, the present disclosure is not limited thereto. In some embodiments, the position and number of monitoring marks

1000 may be variously modified in consideration of process time and monitoring accuracy. For example, as the number of monitoring marks 1000 increases, process time may increase, but monitoring accuracy may also increase. As the number of monitoring marks 1000 decreases, the opposite may be true.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

What is claimed is:

1. A photomask comprising:

a base;

a pattern layer disposed on the base; and a monitoring mark comprising a first sub-monitoring mark which comprises a plurality of test patterns defined as openings penetrating the base and the pattern layer, wherein the first sub-monitoring mark comprises first through n-th test patterns, wherein each of the first through n-th test patterns comprises a first edge and a second edge extending along a first direction and facing each other along a second direction different from the first direction, wherein the second edge of a j-th test pattern among the first through n-th test patterns is spaced apart from the first edge of the j-th test pattern along the second direction by (kn+j) times a unit width, and the unit width is constant along the second direction, wherein n is a natural number more than 1, j is a natural number from 1 to n, and k is a natural number.

2. The photomask of claim 1, wherein the first through n-th test patterns are arranged along the first direction.

3. The photomask of claim 2, wherein the first edges of the first through n-th test patterns are aligned with each other along the first direction.

4. The photomask of claim 1, wherein the j-th test pattern among the first through n-th test patterns has a width (kn+j) times the unit width in the second direction.

5. The photomask of claim 1, wherein the second edge of an i-th test pattern among the first through n-th test patterns overlaps an (i+1)-th test pattern along the first direction, and wherein i is a natural number from 1 to n−1.

6. The photomask of claim 1, wherein the monitoring mark further comprises a second sub-monitoring mark which comprises a plurality of test patterns, wherein the second sub-monitoring mark comprises first through m-th test patterns, wherein each of the first through m-th test patterns comprises a third edge and a fourth edge extending along the first direction and facing each other along the second direction, wherein the fourth edge of a p-th test pattern among the first through m-th test patterns of the second sub-monitoring mark is spaced apart from the third edge along a direction opposite to the second direction by (qm+p) times the unit width, wherein a direction from the third edge to the fourth edge along the second direction is opposite to a direction from the first edge to the second edge along the second direction, and wherein m is a natural number, p is a natural number from 1 to m, and q is a natural number.

7. The photomask of claim 6, wherein the first through m-th test patterns are arranged along the first direction.

8. The photomask of claim 7, wherein the third edges of the first through m-th test patterns are aligned with each other along the first direction.

9. The photomask of claim 6, wherein the p-th test pattern among the first through m-th test patterns has a width (qm+p) times the unit width in the second direction.

10. The photomask of claim 6, wherein the first through n-th test patterns of the first sub-monitoring mark are sequentially disposed along the first direction, and wherein the first through m-th test patterns of the second sub-monitoring mark are sequentially disposed along a direction opposite to the first direction.

11. The photomask of claim 10, wherein the first through n-th test patterns of the first sub-monitoring mark are arranged in the second direction with the m-th through the first test patterns of the second sub-monitoring mark, respectively.

12. The photomask of claim 10, wherein the second sub-monitoring mark is point-symmetric to the first sub-monitoring mark.

13. The photomask of claim 1, wherein the first sub-monitoring mark comprises a plurality of position patterns configured to monitor position information of the test patterns of the first sub-monitoring mark, and wherein each of the position patterns of the first sub-monitoring mark is disposed on one side of a corresponding one of the test patterns.

14. The photomask of claim 1, wherein the test patterns are formed by a plurality of unit laser beams emitted from an exposure device, and wherein the unit width is equal to a width of each unit laser beam.

15. The photomask of claim 1, further comprising:

a main area in which a main pattern identical to a circuit pattern formed on a display panel is disposed; and a peripheral area disposed adjacent to the main area, wherein the monitoring mark is disposed in the peripheral area.

16. A photomask comprising:

a base;

a pattern layer disposed on the base; and a sub-monitoring mark comprising a plurality of test patterns defined as openings penetrating the base and the pattern layer, wherein the sub-monitoring mark comprises first through n-th test patterns, wherein each of the first through n-th test patterns comprises a first edge and a second edge extending along a first direction and facing each other along a second direction different from the first direction, wherein the first edge of an i-th test pattern among the first through n-th test patterns is spaced apart from the first edge of an (i−1)-th test pattern along the second direction by a unit width, and the unit width is constant along the second direction, wherein the second edge of each of the first through n-th test patterns is spaced apart from the first edge of a same test pattern by (kn+i) times the unit width along the second direction, and wherein n is a natural number, i is a natural number from 2 to n, and k is a natural number.

17. The photomask of claim 16, wherein each of the first through n-th test patterns has a width (kn+1) times the unit width in the second direction.

18. The photomask of claim 16, wherein the first through n-th test patterns are arranged along the first direction, and wherein the first edge of the i-th test pattern overlaps the (i−1)-th test pattern along the first direction.

19. A photomask comprising:

a base;

a pattern layer disposed on the base; and a sub-monitoring mark comprising a plurality of test patterns, each including a plurality of openings penetrating the base and the pattern layer, wherein the sub-monitoring mark comprises first through n-th test patterns, wherein each of the first through n-th test patterns comprises the plurality of openings and a plurality of masking areas, which are extending along a first direction and alternately arranged along a second direction different from the first direction, and comprises a first outermost boundary and a second outermost boundary located at opposite outermost positions in the second direction and facing each other among a plurality of boundaries formed between the openings and the masking areas, wherein the first outermost boundaries of the first through n-th test patterns are aligned with each other along the first direction, wherein the second outermost boundary of a j-th test pattern among the first through n-th test patterns is spaced apart from the first outermost boundary of the j-th test pattern along the second direction by (kn+j) times a unit width, and the unit width is constant along the second direction, and wherein n is a natural number, j is a natural number from 1 to n, and k is a natural number.

20. The photomask of claim 19, wherein the second outermost boundary is defined as one of boundaries spaced apart from the first outermost boundary by (kn+1) to (k+1)n times the unit width.

* * * * *